(12) United States Patent
Kubo et al.

(10) Patent No.: US 6,190,975 B1
(45) Date of Patent: Feb. 20, 2001

(54) METHOD OF FORMING HCMOS DEVICES WITH A SILICON-GERMANIUM-CARBON COMPOUND SEMICONDUCTOR LAYER

(75) Inventors: Minoru Kubo, Mie; Katsuya Nozawa; Masakatsu Suzuki, both of Osaka; Takeshi Uenoyama, Kyoto; Yasuhito Kumabuchi, Osaka, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/208,024

(22) Filed: Dec. 9, 1998

Related U.S. Application Data

(62) Division of application No. 08/931,562, filed on Sep. 16, 1997.

(30) Foreign Application Priority Data

| Sep. 17, 1996 | (JP) | 8-244395 |
| Oct. 11, 1996 | (JP) | 8-269578 |
| Nov. 26, 1996 | (JP) | 8-314551 |

(51) Int. Cl.[7] .................................. H01L 21/336
(52) U.S. Cl. .......................... 438/285; 438/199
(58) Field of Search ................ 438/93, 285, 197, 438/199

(56) References Cited

U.S. PATENT DOCUMENTS

| 4,885,614 | 12/1989 | Furukawa et al. . |
| 5,272,365 | 12/1993 | Nakagawa . |
| 5,420,059 | 5/1995 | Mohammad et al. . |

FOREIGN PATENT DOCUMENTS

| 03731000 | 3/1989 | (DE) . |
| 19533313 | 3/1997 | (DE) . |
| 0 494 395 | 7/1992 | (EP) . |
| 6-163600 | 6/1994 | (EP) . |
| 0683522 | 4/1995 | (EP) . |
| 0703628 | 9/1995 | (EP) . |
| 0 829 908 A2 | * 3/1998 | (EP) . |
| 1 014 435 A2 | * 6/2000 | (EP) . |
| 5-275678 | 10/1993 | (JP) . |

OTHER PUBLICATIONS

H.G. Grimmeiss and J. Olajos, "SiGeC: A New Material for Future Microelectronics?", Jun. 1996, 17th Nordic Semiconductor Meeting, pp. 52–59.*

Powell A.R., et al., "Silicon–Germanium–Carbon Alloys Extending SI Based Heterostructure Engineering" Japanese Journal Of Applied Physics, vol. 33, No. 48, Part 1, Apr. 1994, pp. 2388–23.

Ray S.K. "Novel SiGeC Channel Heterojunction PMOSFET" International Electron Devices Meeting, Technical Digest, Dec. 8–11, 1996, pp. 261–264.

Grimmeiss, H.G., et al., Conference Article, 17TH Nordic Semiconductor Meeting, Physica Scripta (1997), R. Swedish Acad. Sci., Sweden, vol. T69, Jun. 17–20, 1996, Trondheim, Norway, pp. 52–59.

Boucaud P., et al., "Growth Of Si1–x–yGexCy Multi–Quantum Wells: Structural and Optical Properties", Thin Solid Films, vol. 278, No. ½, May 15, 1996, pp. 114–117.

* cited by examiner

Primary Examiner—Charles Bowers
Assistant Examiner—Evan Pert
(74) Attorney, Agent, or Firm—McDermott, Will & Emery

(57) ABSTRACT

Si and SiGeC layers are formed in an NMOS transistor on a Si substrate. A carrier accumulation layer is formed with the use of a discontinuous portion of a conduction band present at the heterointerface between the SiGeC and Si layers. Electrons travel in this carrier accumulation layer serving as a channel. In the SiGeC layer, the electron mobility is greater than in silicon, thus increasing the NMOS transistor in operational speed. In a PMOS transistor, a channel in which positive holes travel, is formed with the use of a discontinuous portion of a valence band at the interface between the SiGe and Si layers. In the SiGe layer, too, the positive hole mobility is greater than in the Si layer, thus increasing the PMOS transistor in operational speed. There can be provided a semiconductor device having field-effect transistors having channels lessened in crystal defect.

5 Claims, 16 Drawing Sheets

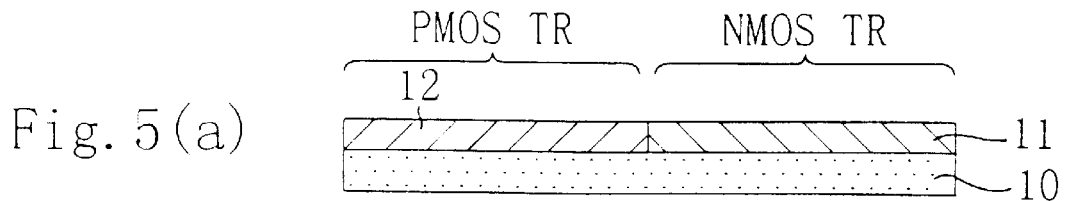
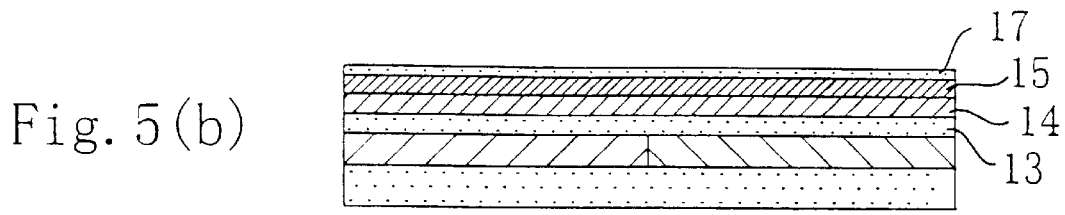
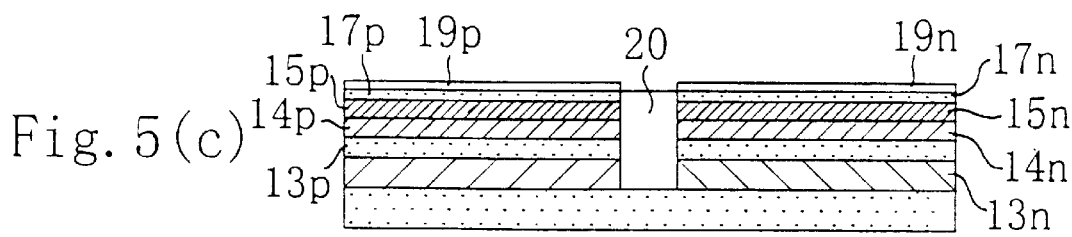
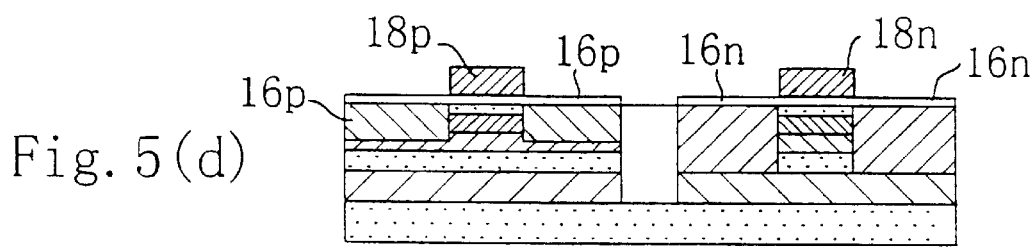
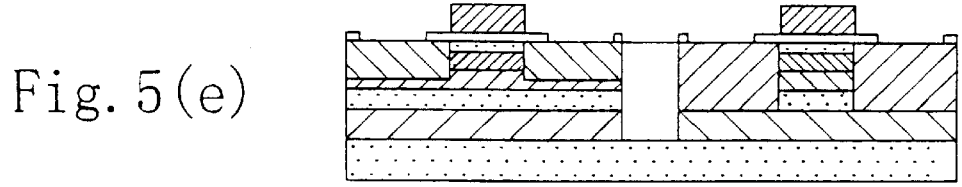
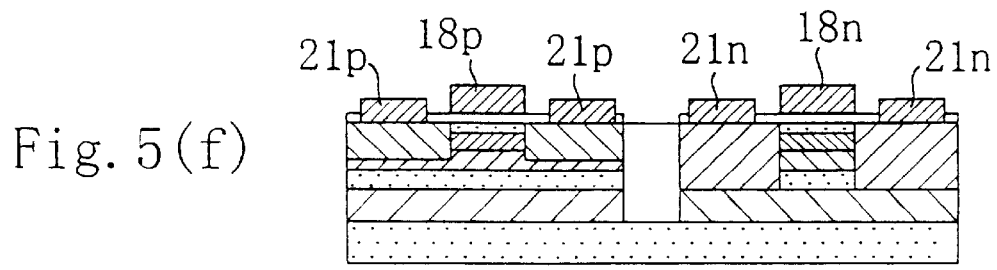

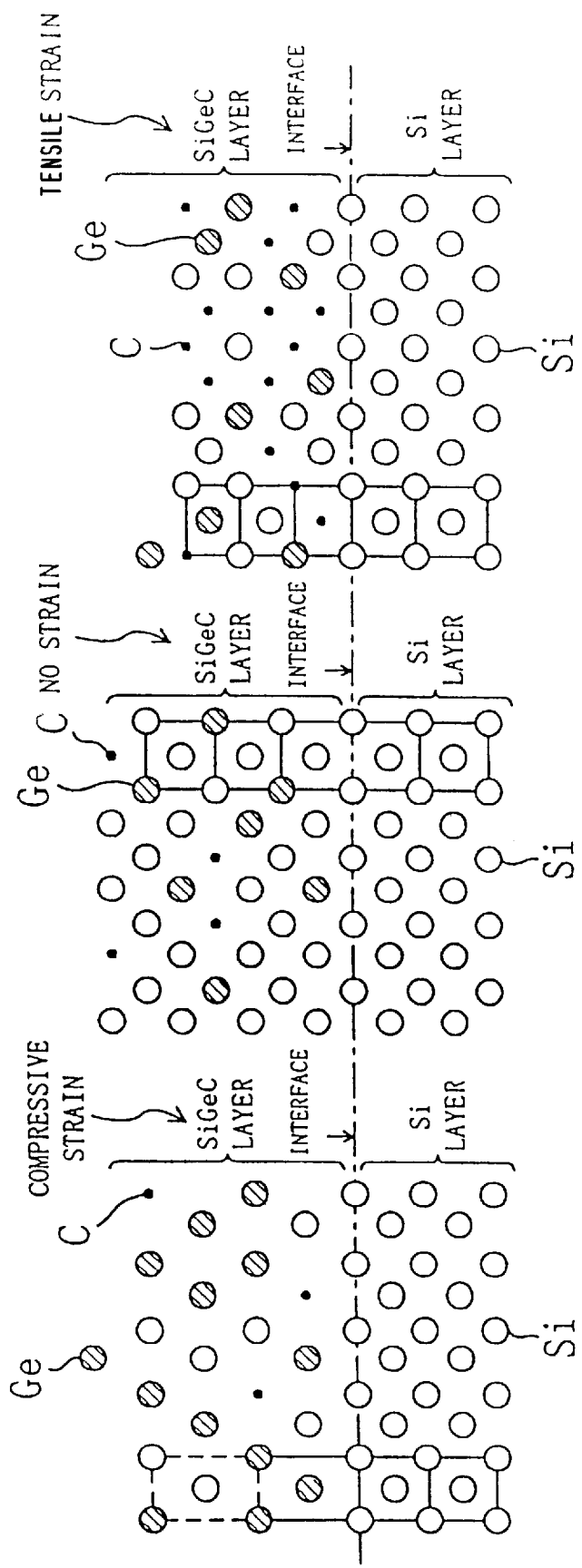

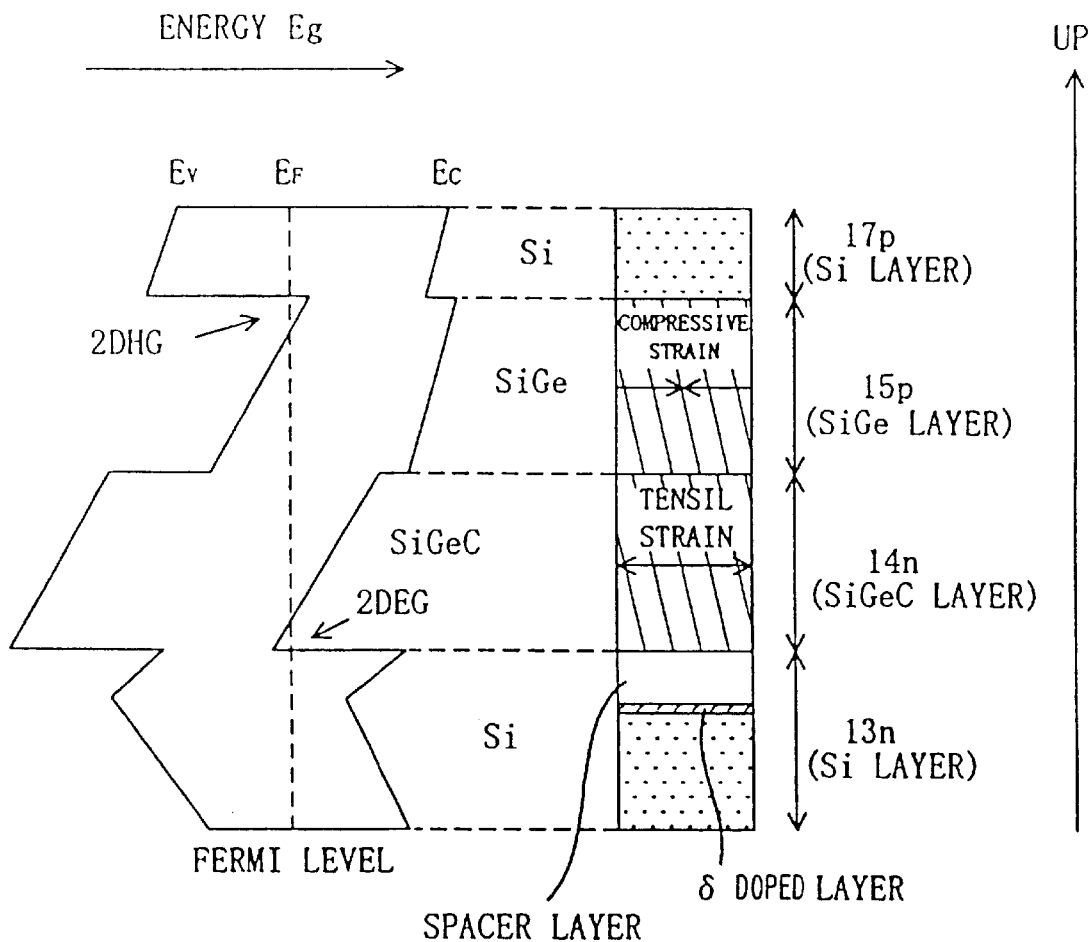

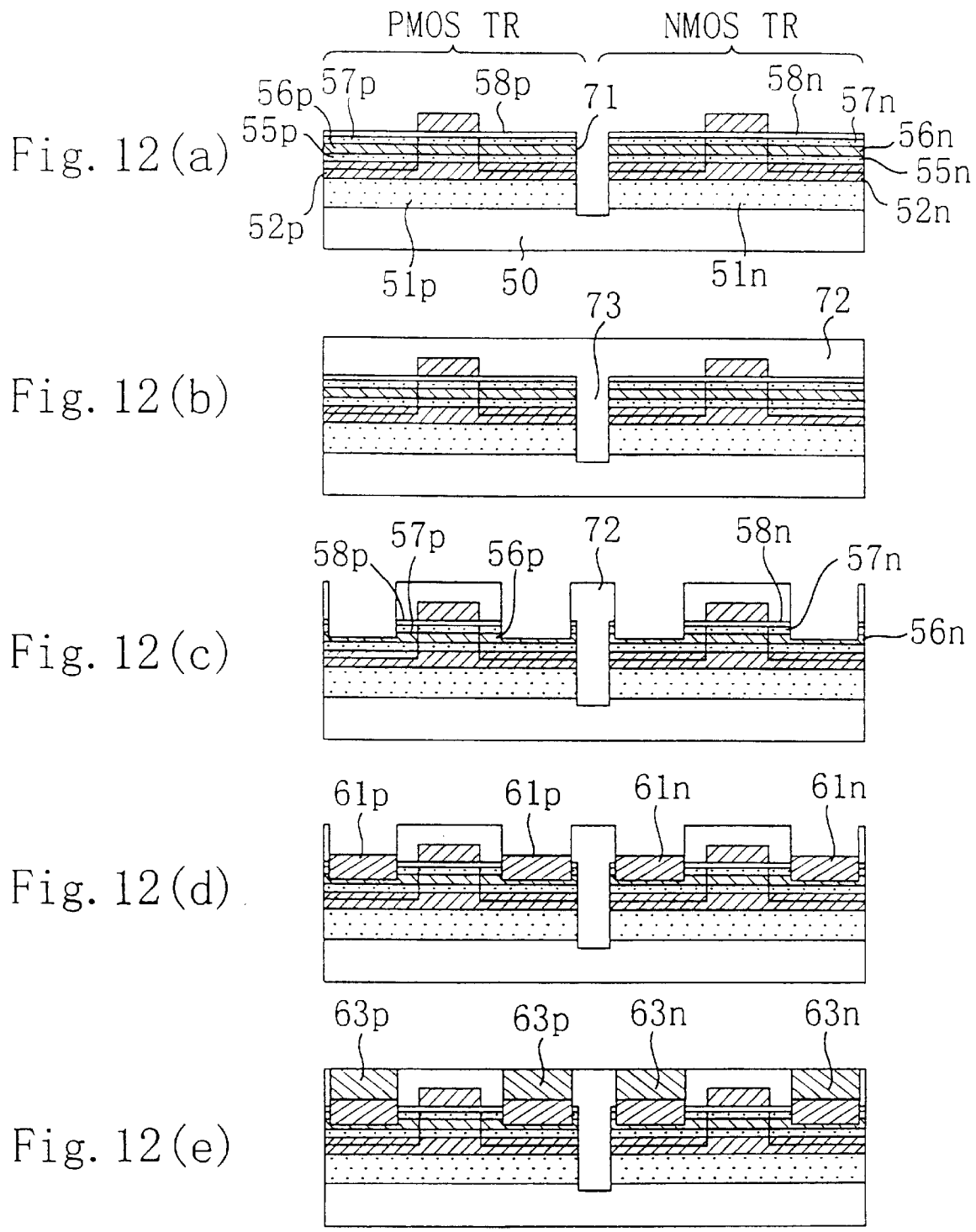

METHOD OF FORMING HCMOS DEVICES WITH A SILICON-GERMANIUM-CARBON COMPOUND SEMICONDUCTOR LAYER

This is a divisional of application Ser. No. 08/931,562, filed Sep. 16, 1997.

BACKGROUND OF THE INVENTION

The present invention relates to a semiconductor device, and more particularly to a semiconductor device having a heterojunction field-effect transistor using a SiGeC or SiGe layer, and to a method of producing this semiconductor device.

Recently, high integration of a semiconductor device is under way. It is even intended to miniaturize a MOS transistor in which a gate length is below 0.1 μm. In such ultra-miniaturization, however, the current driving ability is saturated due to the influence of a short channel effect or an increase in resistance component. Thus, there cannot be expected such improvements in performance that have hitherto been made. In particular, to increase the driving ability of a miniaturized MOS transistor, it is important to improve the mobility of carriers in a channel and to lower a source-drain electrode in contact resistance.

In view of the foregoing, there has been proposed, instead of a complementary semiconductor device (CMOS device) formed on a silicon substrate, a heterostructure CMOS device (hereinafter referred to as an HCMOS device) using Si/SiGe (mixed crystal of the IV-family elements). The HCMOS device utilizes, as a channel, the interface of a heterojunction structure of two kinds of semiconductors different in band gap from each other, instead of the Si/SiO$_2$ interface. By using Si/SiGe capable of providing a carrier mobility higher than that provided by Si, it is expected to achieve a transistor higher in operational speed. By controlling the composition of Si/SiGe, it is possible to form, on a Si substrate, an epitaxial growth layer having the desired amount of strain and the desired value of band gap. Ismail of the IBM company has conducted basic experiments on improvements in characteristics of an HCMOS device of the Si/SiGe type (See K. Ismail, "Si/SiGe High Speed Field-Effect Transistors", IEDM Tech. Dig. 1995, p509 and M. A. Armstrong et al, "Design of Si/SiGe Heterojunction Complementary Metal-Oxide Semiconductor Transistors", IEDM Tech. Dig. 1995, p761).

FIG. 15 is a section view of an example of this HCMOS device. As shown in FIG. 15, there is formed, on a portion of a Si substrate 101, a field-effect transistor comprising source-drain regions 109, a gate insulating layer 107 and a gate electrode 110. Formed in a so-called channel region between the source-drain regions under the gate electrode 110 are a SiGe buffer layer 102, a δ doped layer 115, a spacer layer 103, an i-Si layer 104, an i-SiGe layer 105 and an i-Si layer 106. In these layers, the SiGe buffer layer 102 gives tensile strain to the i-Si layer 104 for forming an n-channel layer 112 between the SiGe buffer layer 102 and the i-Si layer 104. In the SiGe buffer layer 102, the Ge composition rate is gradually changed such that the Ge composition rate in that portion of the layer 102 immediately above the Si substrate 101 is equal to 0%, while the Ge composition rate in the top portion of the layer 102 is equal to 30%.

When a negative bias voltage is applied, the n-channel layer 112 is formed on the heterointerface between the i-Si layer 104 and the SiGe buffer layer 102 thereunder. The δ doped layer 115 is arranged to supply electrons serving as carriers to the n-channel layer 112 which is formed on the δ doped layer 115. The spacer layer 103 is arranged to spatially separate the ions in the δ doped layer 115 formed below the spacer layer 103, from the n-channel layer 112 formed on the spacer layer 103, thus preventing the carrier mobility from being lowered due to ion scattering.

On the other hand, when a positive bias voltage is applied, a p-channel layer 111 is formed, at the side of the i-SiGe layer 105, on the heterointerface between the i-SiGe layer 105 and the i-Si layer 106 thereon. The gate insulating layer 107 is formed to insulate the gate electrode 110 from the p-channel layer 111.

As discussed in the foregoing, the heterojunction field-effect transistor is characterized in that a channel is formed on the heterointerface between two kinds of semiconductor layers different in band gap from each other. Accordingly, to form a channel, there are inevitably present at least two kinds of semiconductor layers different in band gap from each other. In addition, to form, in semiconductor layers, a channel in which electrons or positive holes move at a high speed, it is required to form, at the heterointerface, a discontinuous portion of a conduction or valence band. In the Si/SiGe type above-mentioned, the i-SiGe layer 105 has a discontinuous portion in the valence band with respect to the i-Si layer 106, thus forming a channel for positive holes (See the left portion of FIG. 15). However, the conduction band hardly has a discontinuous portion. Accordingly, tensile strain is induced in the i-Si layer 104 such that a discontinuous portion is formed in the conduction band at the heterointerface between i-Si layer 104 and the i-SiGe layer 105 (See the right portion of FIG. 15).

According to a simulation, it is estimated that, as compared with a conventional CMOS device in the same size using a Si/SiO$_2$ channel, the HCMOS device having the arrangement above-mentioned achieves an operation at double the speed with a half power consumption. More specifically, this is a semiconductor transistor in which a Si semiconductor is combined with a SiGe mixed crystal to form a heterointerface and in which there is formed a channel in which carriers are mobile at a high speed. Thus, attention is placed to this semiconductor transistor as a transistor capable of achieving both a high-speed operation utilizing a heterojunction and large-scale integration of a MOS device.

A heterojunction device utilizing a mixed crystal of the IV-family elements such as SiGe is expected as means for overcoming the functional limit of a CMOS device of prior art. Due to the difficulty in production, however, a heterojunction field-effect transistor using a mixed crystal of the IV-family elements represented by SiGe is behind in research and development as compared with a heterojunction bipolar transistor which is a heterodevice similarly using a mixed crystal such as SiGe. Thus, it cannot be stated that studies have sufficiently be made on the structure capable of providing performance as expected and on the method of producing such structure.

Further, in a heterojunction field-effect transistor having a so-called heterojunction MOS structure having an insulating layer between a gate electrode and a semiconductor layer as above-mentioned, a stable and good insulating layer cannot be formed in the SiGe layer. Accordingly, an oxide layer of SiO$_2$ is used as a gate insulating layer. It is therefore required that a Si layer is always present immediately below the gate insulating layer. However, Si is characterized in that its band gap is always greater than the band gap of SiGe. This is disadvantageous in the above-mentioned HCMOS device of prior art as set forth below.

Firstly, to form an electron channel on the Si substrate 101, tensile strain is induced in the i-Si layer 104 to form a band discontinuous portion at the Si/SiGe heterointerface. However, the lattice constant undergoes a change to induce dislocation due to lattice relaxation.

FIG. 16 is a section view illustrating the SiGe buffer layer 102 and the i-Si layer 104 thereabove, as picked out from FIG. 15. Since the i-Si layer 104 is smaller in lattice constant than the SiGe buffer layer 102, tensile strain will be accumulated at the stage of crystal growth. When such accumulation becomes great, this results in dislocation in the i-Si layer 104 as shown in FIG. 16. Thus, dislocation or line defect is inevitably induced by strain due to lattice misfit between the i-Si layer 104 and the SiGe buffer layer 102. Setting apart from the initial characteristics of a transistor utilizing such a crystal, it is considered that the reliability and life-time of the transistor are influenced by the deterioration in characteristics due to the growth of dislocation in the crystal.

The SiGe buffer layer 102 made of SiGe greater in lattice constant than Si is laminated on the Si substrate 101 and tensile strain is accumulated in the i-Si layer 104 which is grown on the SiGe buffer layer 102. As the thickness of the SiGe buffer layer 102 is increased, the thickness exceeds the critical thickness in which the lattice constant of the SiGe buffer layer 102 is changed from the lattice constant of Si to the original lattice constant of SiGe. This produces lattice relaxation, causing defects such as dislocation or the like to be induced also in the SiGe buffer layer 102.

There are instances where such defects do not exert a significant influence on the initial characteristics of the transistor. In view of long-term reliability and life-time, however, such defects involve a possibility of a serious trouble being caused. More specifically, the transistor is deteriorated due to the growth of defects by an electric current or the diffusion of metal or impurity through the defects, thus possibly causing the transistor to be lowered in reliability.

Secondly, a heterojunction field-effect device using a mixed crystal of the IV-family elements represented by SiGe is effective as a transistor structure capable of overcoming the performance limit of a miniaturized CMOS device of prior art. At this point of time, however, studies on optimization of the contact of each source-drain electrode have not sufficiently been done as compared with studies on improvements in channel mobility. Thus, the structure cannot take full advantage of such high-speed mobility. In the IBM's heterojunction CMOS device technology mentioned earlier, too, detailed studies have been made on improvements in mobility of a channel region, but studies have hardly been made on reduction in resistance of the contact of each source-drain electrode which is another important factor for improvement in performance of a miniaturized transistor.

More specifically, in a CMOS device structure using a single crystal of Si, a variety of studies have been made on the structure of the contact region of the substrate connected to a source-drain electrode. However, studies are required as to whether or not the contact region structure and its production method which are optimized for a general CMOS device, are also good for a heterojunction field-effect device different in transistor structure.

SUMMARY OF THE INVENTION

It is a first object of the present invention to provide a semiconductor device high in carrier mobility and reliability in which there is utilized, as a structure in a channel region under a gate of an HCMOS device, a heterojunction structure in lattice fit or substantially in lattice fit, yet having a band discontinuous portion where a carrier accumulation layer can be formed.

It is a second object of the present invention to provide a semiconductor device having contact regions low in contact resistance without excellent characteristics of a heterostructure field-effect device injured, and to provide a method of producing the semiconductor device above-mentioned.

To achieve the first object, the present invention provides a first semiconductor device, a second semiconductor device and a first semiconductor device producing method.

To achieve the second object, the present invention provides a third semiconductor device and a second semiconductor device producing method.

The first semiconductor device according to the present invention comprises a field-effect transistor which is formed on a portion of a semiconductor substrate and which comprises a gate electrode, source-drain regions and a channel region between the source-drain regions, and the channel region comprises: a Si layer; a $Si_{1-x-y}Ge_xC_y$ layer ($0 \leq x \leq 1$, $0 < y \leq 1$) which is formed as coming in contact with the Si layer and in which the composition rate y of C is in the range from 0.01 to 0.03; and a carrier accumulation layer formed in that portion of the $Si_{1-x-y}Ge_xC_y$ layer which is adjacent to the Si layer.

At the interface between the Si layer and the $Si_{1-x-y}Ge_xC_y$ layer in which the composition rate y of C is in the range from 0.01 to 0.03, there can be formed a band discontinuous portion required for forming a carrier accumulation layer in which carriers are two-dimensionally confined. Since this carrier accumulation layer functions as a channel, there can be obtained a field-effect transistor high in operational speed in which the $Si_{1-x-y}Ge_xC_y$ layer giving a higher carrier mobility than in the Si layer, serves as a channel. Further, control can be made such that lattice misfit between the $Si_{1-x-y}Ge_xC_y$ layer and the Si layer does not occur or is minimized. It is therefore possible to make an adjustment such that lattice strain is not induced or substantially not induced. This enables the $Si_{1-x-y}Ge_xC_y$ layer to be formed with no crystal defect induced therein. Thus, a highly reliable semiconductor device can be obtained.

According to the present invention, the composition rates of the respective elements in the $Si_{1-x-y}Ge_xC_y$ layer may be adjusted such that the $Si_{1-x-y}Ge_xC_y$ layer and the Si layer are fitted in lattice for each other.

This enables a channel to be formed in the $Si_{1-x-y}Ge_xC_y$ layer free from strain due to lattice misfit. Thus, a highly reliable semiconductor device can be obtained.

According to the present invention, provision may be made such that the $Si_{1-x-y}Ge_xC_y$ layer has a lattice constant smaller than that of the Si layer and has such a thickness as to induce no lattice relaxation.

With the arrangement above-mentioned, tensile strain is induced in the $Si_{1-x-y}Ge_xC_y$ layer. This increases the amount of a band discontinuous portion with respect to the Si layer, thus enhancing the carrier confining efficiency.

According to the present invention, carriers accumulated in the carrier accumulation layer may be negative.

According to the present invention, a carrier supply layer for supplying carriers to the carrier accumulation layer is preferably formed in that portion of the Si layer which is adjacent to the $Si_{1-x-y}Ge_xC_y$ layer.

Preferably, the present invention is arranged such that carriers accumulated in the carrier accumulation layer are negative, that there is formed another field-effect transistor which is formed on other portion of the semiconductor substrate and which comprises a gate electrode, source-drain regions and a channel region between the source-drain regions, and that the channel region of another field-effect transistor comprises: a second Si layer; a SiGe layer formed adjacent to the second Si layer; and a second carrier accumulation layer for accumulating positive carriers, which is formed in that portion of the SiGe layer adjacent to the second Si layer.

With the arrangement above-mentioned, there can be obtained a semiconductor device functioning as an HCMOS device which assures a high carrier mobility in each of the n-channel and p-channel sides.

According to the present invention, the $Si_{1-x-y}Ge_xC_y$ or SiGe layer may be a quantum well region.

With the arrangement above-mentioned, there can be obtained a field-effect transistor having a channel high in carrier confining efficiency.

According to the present invention, each of the source-drain regions may comprise a first semiconductor layer and a second semiconductor layer greater in band gap than the first semiconductor layer, and there may further be formed source-drain contact layers each of which is made of a conductive layer low in resistance and each of which is formed immediately above the first semiconductor layer.

With the arrangement above-mentioned, a semiconductor device low in contact resistance can be obtained even with the use of a heterojunction structure.

The second semiconductor device according to the present invention comprises: a field-effect transistor which is formed on a portion of a semiconductor substrate and which comprises a gate electrode; source-drain regions; and a channel region between the source-drain regions, and the channel region comprises: a first Si layer; a first $Si_{1-x-y}Ge_xC_y$ layer ($0 \leq x \leq 1$, $0<y \leq 1$) which is formed as coming in contact with the first Si layer; a second Si layer; a second $Si_{1-x-y}Ge_xC_y$ layer ($0 \leq x \leq 1$, $0 \leq y \leq 1$) which is formed as coming in contact with the second Si layer and which is different in band gap from the first $Si_{1-x-y}Ge_xC_y$ layer; and first and second carrier accumulation layers for respectively confining different conductive carriers, these first and second carrier accumulation layers being respectively formed in that portion of the first $Si_{1-x-y}Ge_xC_y$ layer which is adjacent to the first Si layer and in that portion of the second $Si_{1-x-y}Ge_xC_y$ layer which is adjacent to the second Si layer.

According to the arrangement above-mentioned, there can be obtained a semiconductor device functioning as an HCMOS device having n-channel and p-channel field-effect transistors each having a channel high not only in carrier confining efficiency but also in operational speed. Further, control can be made such that lattice misfit between the first $Si_{1-x-y}Ge_xC_y$ layer and the first Si layer does not occur or is minimized. This enables the first $Si_{1-x-y}Ge_xC_y$ layer to be formed with no crystal defect induced therein. Thus, a highly reliable semiconductor device can be obtained.

According to the present invention, the composition rate y of C in the second $Si_{1-x-y}Ge_xC_y$ layer may be equal to 0.

According to the present invention, there may further be disposed a MOS transistor which is formed on the semiconductor substrate and in which a semiconductor layer formed of a single element serves as a channel region.

With the arrangement above-mentioned, a transistor provided in the channel region thereof with the first $Si_{1-x-y}Ge_xC_y$ layer may be used for a circuit requiring a high operational speed, and a usual MOS transistor may be used for other circuit, thus enabling the applicable range of the semiconductor device to be enlarged.

According to the present invention, provision may be made such that the first $Si_{1-x-y}Ge_xC_y$ layer has a lattice constant smaller than that of the first Si layer and has such a thickness as to induce no lattice relaxation.

With the arrangement above-mentioned, tensile strain is induced in the first $Si_{1-x-y}Ge_xC_y$ layer. This increases the amount of a band discontinuous portion with respect to the first Si layer, thus enhancing the carrier confining efficiency.

According to the present invention, a carrier supply layer for supplying carriers to the first carrier accumulation layer is preferably formed in that portion of the first Si layer which is adjacent to the first $Si_{1-x-y}Ge_xC_y$ layer.

The third semiconductor device according to the present invention comprises at least one field-effect transistor formed on a semiconductor substrate, and this field-effect transistor comprises: a channel region comprising a first semiconductor layer including a $Si_{1-x-y}Ge_xC_y$ layer ($0 \leq x \leq 1$, $0 \leq y \leq 1$), a second semiconductor layer different in band gap from the first semiconductor layer, and a carrier accumulation layer formed in the vicinity of the interface between the first and second semiconductor layers; source-drain regions each comprising: a third semiconductor layer and a fourth semiconductor layer greater in band gap than the third semiconductor layer; and source-drain contact layers each of which is made of a conductive layer, each of which is low in resistance and each of which is formed immediately above the third semiconductor layer.

The arrangement above-mentioned can lower the resistance of a contact with respect to each source-drain region in the field-effect transistor high not only in carrier mobility but also in operational speed with the use of a heterojunction structure.

The present invention may be arranged such that the first semiconductor layer also serves as the third semiconductor layer, that the second semiconductor layer also serves as the fourth semiconductor layer, and that the second semiconductor layer is formed on the first semiconductor layer.

The present invention may be arranged such that the first and third semiconductor layers are respectively formed by different semiconductor layers, that the third semiconductor layer is formed on the first semiconductor layer, and that the fourth semiconductor layer is formed on the third semiconductor layer.

The first semiconductor device producing method according to the present invention, provides a method of producing a semiconductor device including an n-channel field-effect transistor and a p-channel field-effect transistor, and comprises: a first step of forming, on a semiconductor substrate, a first Si layer and a first $Si_{1-x-y}Ge_xC_y$ layer ($0 \leq x \leq 1$, $0<y \leq 1$) which comes in contact with the first Si layer and in which a first carrier accumulation layer serving as a channel of the n-channel field-effect transistor is formed in that portion of the first $Si_{1-x-y}Ge_xC_y$ layer which is adjacent to the first Si layer; a second step of forming, on the semiconductor substrate, a second Si layer and a second $Si_{1-x-y}Ge_xC_y$ layer ($0 \leq x \leq 1$, $0 \leq y \leq 1$) which comes in contact with the second Si layer, which is different in band gap from the first $Si_{1-x-y}Ge_xC_y$ layer and in which a second carrier accumulation layer serving as a channel of the p-channel field-effect transistor is formed in that portion of the second $Si_{1-x-y}Ge_xC_y$ layer which is adjacent to the second Si layer; a third step of depositing a conductive layer on the first or second $Si_{1-x-y}Ge_xC_y$ layer whichever is the upper, and patterning the conductive layer to form the gate electrodes of the n- and p-channel field-effect transistors; and a fourth step of introducing, with the gate electrodes of the field-effect transistors used as masks, (i) n-type impurity into the n-channel field-effect transistor forming region in depth which reaches at least the first carrier accumulation layer and (ii) p-type impurity into the p-channel field-effect transistor forming region in depth which reaches at least the second carrier accumulation layer, thus forming source-drain regions of the n- and p-channel field-effect transistors.

According to the method above-mentioned, the second semiconductor device of the present invention can readily be produced.

The second semiconductor device producing method of the present invention provides a method of producing a semiconductor device which has a first semiconductor layer including a $Si_{1-x-y}Ge_xC_y$ layer ($0 \leq x \leq 1$, $0 \leq y \leq 1$), a second semiconductor layer different in band gap from the first semiconductor layer and a carrier accumulation layer serving as a channel formed in the vicinity of the interface between the first and second semiconductor layers, and which serves as a field-effect transistor, and this second semiconductor device method comprises: a first step of successively forming, on a field-effect transistor forming region of a semiconductor substrate, a third semiconductor layer and a fourth semiconductor layer greater in band gap than the third semiconductor layer; a second step of depositing a conductive layer on the fourth semiconductor layer and patterning the conductive layer to form a gate electrode; a third step of introducing impurity into those portions of the field-effect transistor forming region which are located at both lateral sides of the gate electrode, thus forming source-drain regions, the impurity being introduced in depth which reaches at least the carrier accumulation layer; a fourth step of etching the fourth semiconductor layer in the source-drain regions until at least the third semiconductor layer is exposed; and a fifth step of forming, on the exposed surface of the third semiconductor layer, source-drain contact layers made of conductive layers low in resistance.

According to the method above-mentioned, the third semiconductor device of the present invention can readily be produced.

According to the present invention, the fourth step is preferably executed under etching conditions in which the etching selectivity for the third and fourth semiconductor layers is high.

BRIEF DESCRIPTION OF THE DRAWINGS

FIG. 5 (a) to FIG. 5 (f) are section views illustrating the steps of producing a semiconductor device according to the first embodiment of the present invention;

FIG. 6 (a) to FIG. 6 (c) are views illustrating the relationships between strain due to lattice misfit and the composition of the SiGeC layer of a second embodiment of the present invention;

FIGS. 7(a) and 7(b) is a view illustrating the band lineup in a lattice-fit SiGeC HCMOS device of the second embodiment of the present invention;

FIG. 12 (a) to FIG. 12 (e) are section views illustrating the second half of the steps of producing the HCMOS device according to the fourth embodiment of the present invention;

DETAILED DESCRIPTION OF PREFERRED EMBODIMENTS

First Embodiment

An HCMOS device according to a first embodiment of the present invention is a field-effect transistor unit which uses a three-element mixed crystal of SiGeC comprising C added to SiGe/Si, in which the SiGeC layer and the Si layer are substantially fitted in lattice for each other, and in which a band discontinuous portion is formed at a heterointerface due to a difference in band gap energy.

Figure 1:
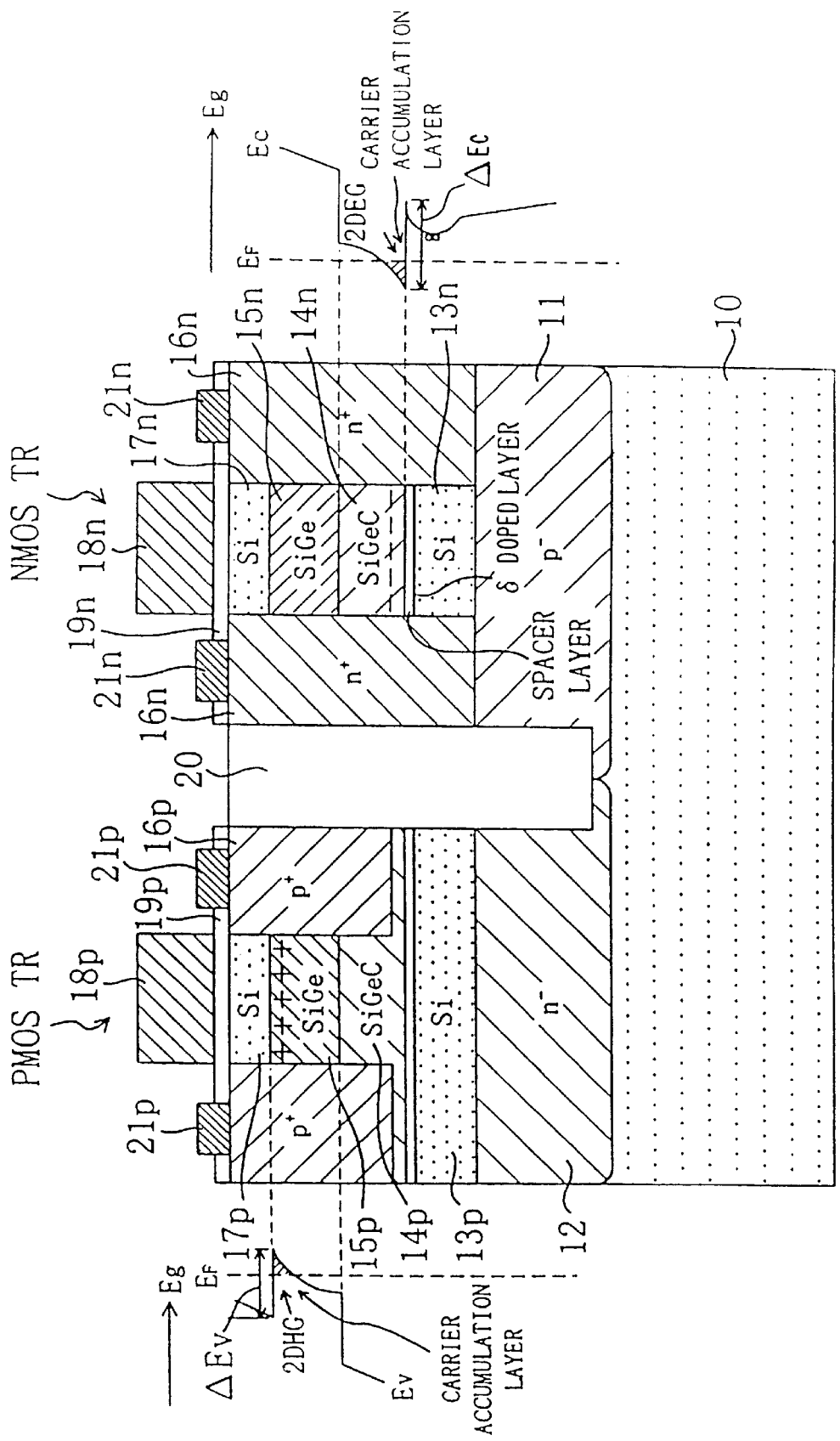
FIG. 1 section view illustrating the structure of a SiGeC HCMOS device according to a first embodiment of the present invention.

FIG. 1 is a section view illustrating the structure of the HCMOS device of the first embodiment. As shown in FIG. 1, NMOS and PMOS transistors are formed on a silicon substrate 10. The following description will first discuss the structure of the NMOS transistor.

In the NMOS transistor, a p-well 11 (high-concentration p-type silicon layer) is formed on the silicon substrate 10. Successively formed on the p-well 11 are (i) a Si layer 13n having a δ doped layer which has been doped with a V-family element in high concentration, and a spacer layer, and (ii) a SiGeC layer 14n (in which the C concentration is 4%, while the Ge concentration is 36%). As will be discussed later, the composition rates of the respective elements in the SiGeC layer 14n are set such that the SiGeC layer 14n and the Si layer 13n immediately therebelow are fitted in lattice for each other.

In the heterointerface between the SiGeC layer 14n and the Si layer 13n, there is present a band discontinuous portion of a conduction band Ec having a band offset value ΔEc, as shown in the right portion of FIG. 1. Formed at this band discontinuous portion is a carrier accumulation layer in which electrons serving as negative carriers are confined as two-dimensional electron gas (2DEG). The carrier accumulation layer formed in the vicinity of the interface at the side of the SiGeC layer 14n, will serve as a channel in which electrons travel at a high speed. In the SiGeC layer 14n, the electron mobility is higher than in the Si layer, thus increasing the operational speed of this NMOS transistor.

Successively formed on the SiGeC layer 14n are a SiGe layer 15n (in which the Ge concentration is 30%, while the Si concentration is 70%), and a Si layer 17n. A gate insulating layer 19n comprising a silicon oxide layer is formed on the surface of the Si layer 17n. Because the Si layer 17n is present below the gate insulating layer 19n, the gate insulating layer 19n high in crystallinity can readily be formed merely by oxidizing the surface of the Si layer 17n. A gate electrode 18n is formed on the gate insulating layer 19n. Source-drain layers 16n are formed in the substrate at both lateral sides of the gate electrode 18n. The travel of electrons within the SiGeC layer 14n is controlled by a voltage applied to the gate electrode 18n. In FIG. 1, the source-drain layers 16n are formed in depth which reaches the p-well 11, but may be formed at least in depth corresponding to that portion of the SiGeC layer 14n which will result in a channel.

The PMOS transistor has substantially the same structure as that of the NMOS transistor discussed in the foregoing. An n-well 12 (high-concentration n-type Si layer) is formed on the silicon substrate 10. Successively formed on the n-well 12 are (i) a Si layer 13p having a δ doped layer which has been doped with a V-family element in high concentration and (ii) a SiGeC layer 14p (in which the Ge concentration is 8.2%, while the C concentration is 1%). Further successively formed on the SiGeC layer 14p are a SiGe layer 15p (in which the Ge concentration is 30%, while the Si concentration is 70%) and a Si layer 17p. In the PMOS transistor, positive holes serve as carriers. The channel in which the positive holes travel, is formed at the side of the SiGe layer 15p of the interface between the SiGe layer 15p and the Si layer 17p. A band discontinuous portion of the valence band having a band offset value $\Delta Ev$ is present at the heterointerface between the SiGe layer 15p and the Si layer 17p. A carrier accumulation layer is formed at this discontinuous portion. Accordingly, the positive holes travel in the channel of carrier accumulation layer formed at the side of the SiGe layer 15p of the interface. In the SiGe layer 15p, too, the mobility of positive holes is higher than in the Si layer, thus increasing the operational speed of the PMOS transistor.

In the PMOS transistor, a gate insulating layer 19p comprising a silicon oxide layer is formed on the Si layer 17p. Source-drain layers 16p are formed at both sides of a gate electrode 18p. The travel of positive holes in the SiGe layer 15p is controlled by a voltage applied to the gate electrode 18p.

Disposed between the NMOS and PMOS transistors is a trench isolation 20 formed by embedding, with a silicon oxide layer, a groove formed in the substrate. The trench isolation 20 electrically separates the NMOS and PMOS transistors from each other.

The Si layers 13n, 13p, the SiGeC layers 14n, 14p, the SiGe layers 15n, 15p, and the Si layers 17n, 17p are simultaneously formed through crystal growth. For example, the sizes of the respective layers can be set to the following sizes, but are not limited thereto.

The thickness of each of the Si layers 13n, 13p is for example equal to about 0.6 μm, and is preferably in the range from 0 to 1 μm. The thickness of each spacer layer is for example equal to about 30 nm, and is preferably in the range from 0 to 50 nm. The thickness of each of the SiGeC layers 14n, 14p is preferably in the range from 3 to 50 nm. The thickness of each of the SiGe layers 15n, 15p is equal to about 5 nm and is preferably in the range from 3 to 5 nm. The thickness of each of the Si layers 17n, 17p is equal to about 1 nm and is preferably in the range from 0.5 to 5 nm. The thickness of each of the gate insulating layers 19n, 19p is for example about 5 nm.

In each of the gate electrodes 18n, 18p, the gate length is equal to 0.25 μm and the gate width is equal to 2.5 μm. The width of each source-drain region is equal to about 1.2 μm. The contact area of each of source-drain electrodes 21n, 21p is equal to about 0.5 μm×about 0.6 μm. The doping concentration of each of the wells 13n, 13p is in the range from about $1\times10^{17}$ to $1\times$ about $10^{18}$ cm$^{-3}$. The doping concentration of each of the δ doped layers is in the range from about $1\times10^{18}$ to about $1\times10^{20}$ cm$^{-3}$.

The HCMOS device (Heterostructure CMOS device) of this embodiment is characterized in that a SiGeC layer is used. By adjusting the composition rates of Si, Ge and C in the SiGeC layer, the band gap amount and lattice misfit with respect to silicon can be changed. The following description will discuss in detail the relationship between the composition rates of Si, Ge and C and each of the strains and band offset amounts of the layers in the first embodiment.

Figure 2:
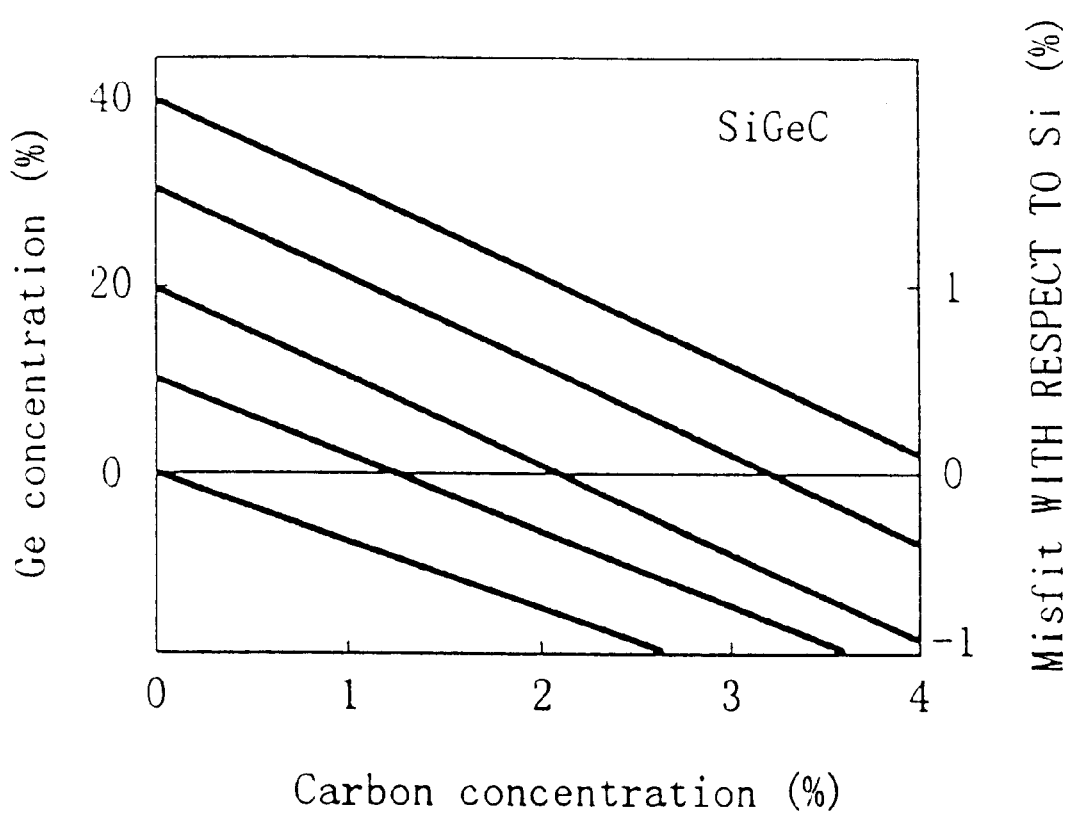
FIG. 2 is a view illustrating the dependency of lattice strain of the SiGeC layer in the HCMOS device in FIG. 1 upon Ge and C concentrations.

FIG. 2 shows how the lattice misfit (%) between the SiGeC layer and the Si layer changes with the concentrations (%) of C and Ge respectively shown on the axis of abscissa and the axis of ordinate. The misfit zero line represents that the SiGeC layer and the Si layer are equal in lattice constant to each other. The lattice constant of a single crystal of Ge (germanium) is greater than that of a single crystal of Si, and the lattice constant of a single crystal of C (carbon) is smaller than that of a single crystal of Si. Accordingly, by adjusting the composition rates of Ge and C, the lattice constant of the SiGeC layer 14n can be made equal to that of the Si layer 13n.

Figure 3:
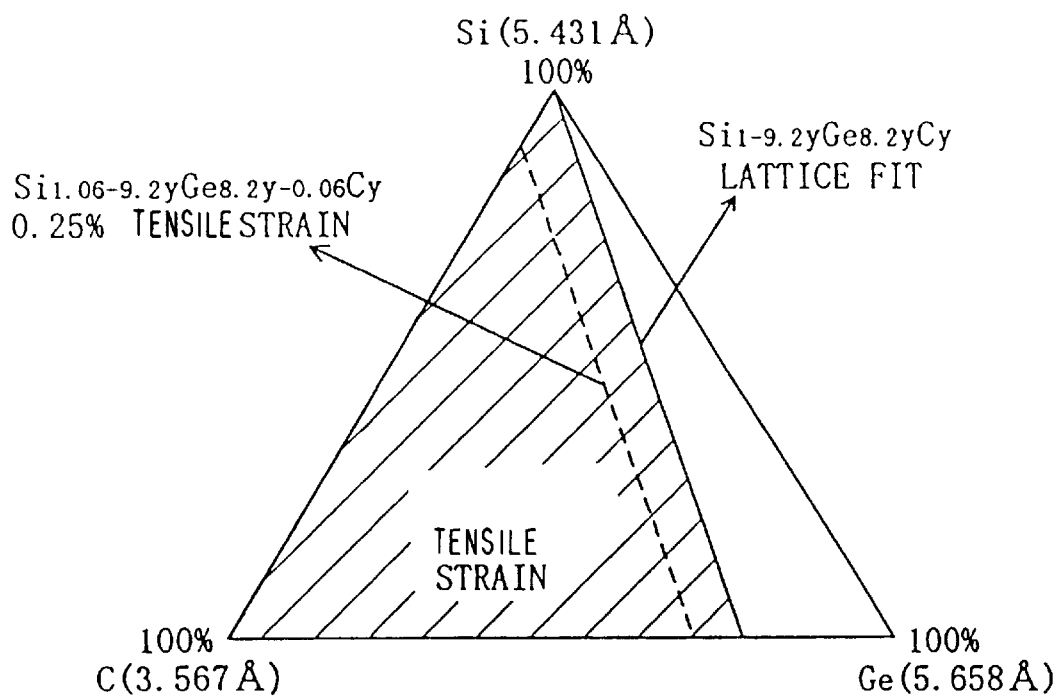
FIG. 3 is a view illustrating the relationship among Si, Ge, C concentrations which produce a lattice fit or tensile strain between the SiGeC layer and the Si layer in the SiGeC HCMOS device in FIG. 1.

FIG. 3 is a characteristic view illustrating the relationship between the composition rates of three elements Si, Ge, C and lattice fit. In FIG. 3, the three apexes represent the points where the respective concentrations of Si, Ge, C are equal to 100% (the composition rates are equal to 1). Thus, FIG. 3 shows how the lattice misfit with respect to Si changes by adjusting the composition of three-element mixed crystal of the SiGeC layer. In FIG. 3, the hatched zone is a composition zone which gives tensile strain to the SiGeC layer, and the solid line shows the conditions of composition of the respective elements under which the lattice misfit between the SiGeC layer and the Si layer is zero or under which the SiGeC layer and the Si layer are fitted in lattice matched for each other. The lattice constant of Ge is greater by 4.2% than that of Si, and the lattice constant of C is smaller by 34.3% than that of Si. Accordingly, by increasing the composition rate of Ge by 8.2 times of the composition rate of C, the lattice constant of the SiGeC layer can be agreed with the lattice constant of the Si layer.

In the SiGeC layer 14n of the first embodiment, the Ge concentration is equal to 8.2% (x=0.082) and the C concentration is equal to 1% (y=0.01). Accordingly, it is understood from FIG. 3 that the lattice misfit of the SiGeC layer 14n with respect to the Si substrate is zero and that the SiGeC layer 14n and the Si layer 13n therebelow have the same lattice constant.

Figure 4:
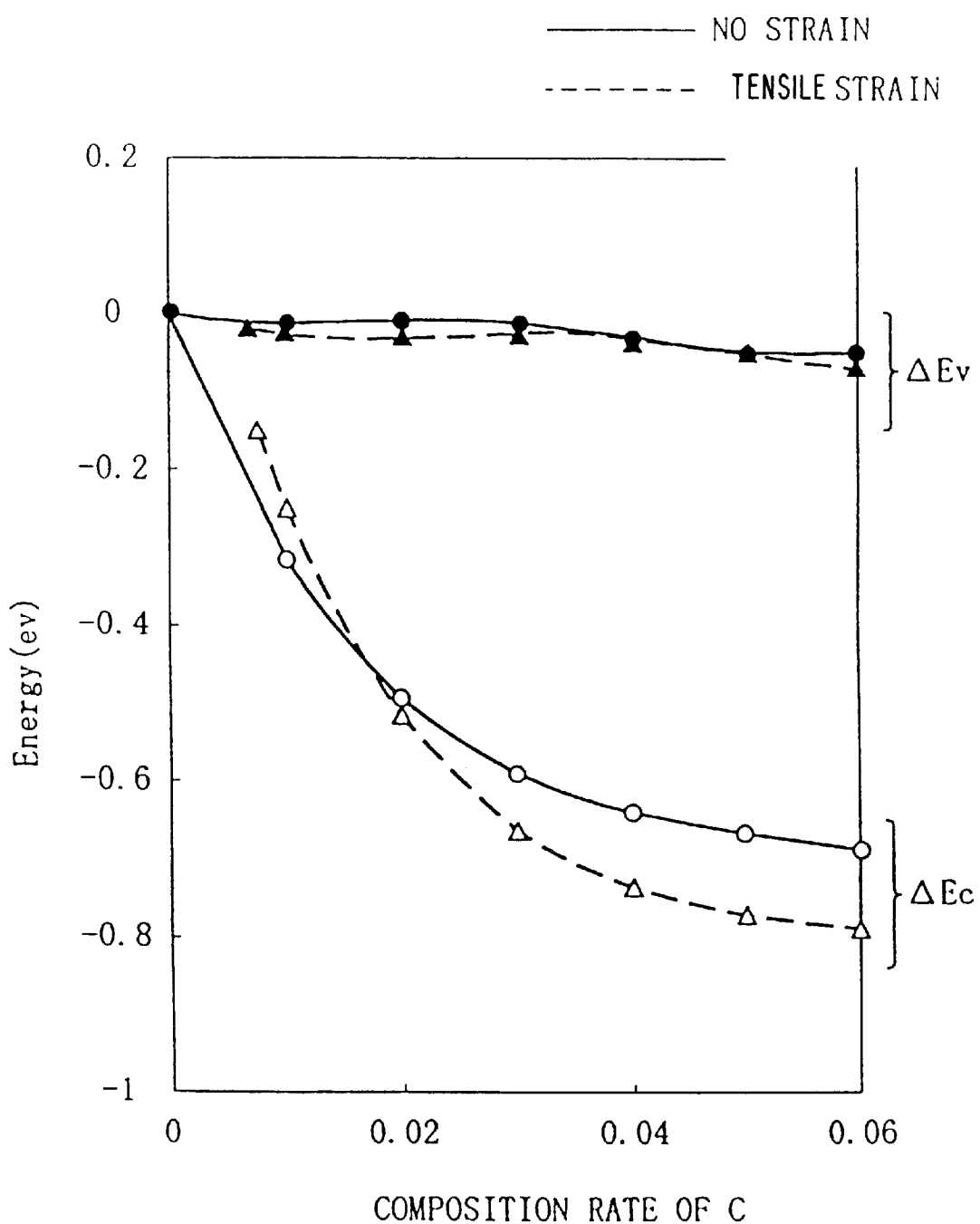
FIG. 4 is a view illustrating the relationship between an energy gap value and the C composition rate in the SiGeC layer in the HCMOS device in FIG. 1.

FIG. 4 shows how the band offset value $\Delta Ec$ of the conduction band and the band offset value $\Delta Ev$ of the valence band at the interface between the SiGeC layer and the Si layer, are changed with the composition rate of C and the energy level respectively shown on the axis of abscissa and the axis of ordinate. In FIG. 4, the black circles show the band offset values ΔEv of the valence band and the white circles show the band offset values ΔEc of the conduction band. In FIG. 4, the original point of the energy is set to the energy value at the lower end of the conduction band of Si for the conduction band, and to the energy value at the upper end of the valence band of Si for the valence band. In FIG. 4, the solid lines correspond to the layer in which no strain is induced, while the dotted lines correspond to the layer in which tensile strain is induced.

As shown in FIG. 4, it is understood in the first embodiment that the band offset values of the conduction and valence bands at the respective interfaces between the SiGeC layer (in which the composition rate of C is equal to 0.01) and the Si layer, are respectively 300 meV and 0 meV, and that at the interface between the SiGeC layer and the Si layer, a discontinuous portion is not formed in the valence band, but is formed only in the conduction band. In the SiGeC layer 14n of the first embodiment, the composition rate of C is equal to 0.01. Accordingly, the SiGeC layer 14n and the Si layer 13n are fitted in lattice for each other. This prevents a defect such as dislocation or the like from being induced in the SiGeC layer 14n having a channel in which two-dimensional electron gas travels. That is, if the SiGeC layer 14n and the Si layer 13n therebelow are misfitted in lattice for each other, such a defect is induced in the SiGeC layer 14n.

In the first embodiment, a discontinuous portion is not formed in the valence band at the interface between the SiGeC layer 14n and the Si layer 13n. Accordingly, positive holes cannot be confined in the SiGeC layer 14n. Therefore, the PMOS transistor using positive holes as carriers, utilizes a heterojunction between the SiGe layer 15p and the Si layer 17p. The lattice constant of the single crystal of SiGe is greater than that of the single crystal of Si, and the SiGe layer 15p is located above the SiGeC layer 14p fitted in lattice for the Si layer 13p. Accordingly, the band offset value in the valence band is large because of changes in band structure due to compressive strain. In this case, too, when an electric field is applied from the gate, positive holes are two-dimensionally confined (2DHG) by band inclination, thus forming a carrier accumulation layer. Therefore, the carrier accumulation layer in the SiGe layer 15p will result in a channel in which the positive holes travel at a high speed.

According to the structure of the first embodiment discussed in the foregoing, the NMOS transistor is arranged such that, by adjusting the composition rates of the respective elements Si, Ge, C of the SiGeC layer 14n, the SiGeC layer 14n can be fitted in lattice for the Si layer 13n while maintaining the band offset value of the conduction band at a value sufficient to accumulate two-dimensional electron gas. Thus, the NMOS transistor can achieve a high-speed operation utilizing the high carrier mobility of the two-dimensional electron gas in the SiGeC layer, yet providing a high reliability by reducing the defect density. Since no discontinuous portion is formed in the valence band at the interface between the SiGeC layer 14n and the Si layer 13n, the positive holes cannot be confined in the SiGeC layer 14n. However, by utilizing a heterojunction between the SiGe layer 15p and the Si layer 17p, there can be formed a channel for the PMOS transistor using positive holes as carriers, thus achieving a high-speed operation.

By integrating the NMOS transistor high in speed with the PMOS transistor high in speed using SiGe to form band discontinuous portion in the valence band, there can be achieved a high-performance HCMOS device.

In the first embodiment, the Ge concentration is equal to 8.2% and the C concentration is equal to 1%. However, it is understood from FIG. 4 that, to maximize the band discontinuous portion or band offset value ΔEv in the lattice-fit type, it is enough to increase the composition rate of C. When such a large band offset value ΔEv is provided, the two-dimensional electron gas (2DEG) confined in the heterointerface does not get over the heterointerface but travels in a stable manner even though the electron concentration is high. In particular, the composition rate of C is preferably in the range from 0.01 to 0.03. In this range, there can be obtained, in both the non-strain and tensile strain types, a proper band offset value ΔEv (=−0.2 to −0.6) for forming a carrier accumulation layer in which the two-dimensional electron gas is to be confined.

In the first embodiment, the Ge concentration in the SiGe layer 15p is set to 30%. To increase the band offset value, however, the Ge concentration may be increased to increase the compressive strain.

Since the HCMOS device is formed on a Si substrate, the HCMOS device may be used for a circuit in which high speed is required, while a usual CMOS device formed on an active region having a single composition of Si may be used for other circuit. Thus, the HCMOS device having the arrangement above-mentioned can be integrated with a MOS field-effect transistor directly formed on a Si substrate. As a device using SiGeC, p- and n-type transistors are not necessarily formed on the same substrate. Accordingly, the following measure may be taken, for example, for an integrated circuit used for a mobile communication device. That is, an amplifier, a mixer or the like used in a high frequency region in which a high-speed operation is required, is not required to form a complementary circuit. Therefore, such an amplifier, a mixer or the like is formed of a MOS transistor using SiGeC of only one of the p- and n-types (for example, the n-type). A component which is arranged to execute a digital signal processing and which is required to form a complementary circuit, may be formed of a CMOS device using a single composition of Si.

Referring to FIG. 5 (a) to FIG. 5 (f), the following description will discuss a method of producing the HCMOS device of the first embodiment. FIG. 5 (a) to FIG. 5 (f) are section views illustrating an example of the process for producing the HCMOS device shown in FIG. 1.

At the step shown in FIG. 5 (a), the p- and n-wells 11, 12 are formed, by ion injection, on the silicon substrate 10.

At the step shown in FIG. 5 (b), the Si layer 13 including the δ doped layer, the SiGeC layer 14 (Ge: 8.2%, C: 1%), the SiGe layer 15 and the Si layer 17 are grown on the wells 11, 12 using a UHV-CVD method. The δ doped and spacer layers which are actually formed, are omitted in FIG. 5 for convenience' sake.

At the step shown in FIG. 5 (c), to electrically separate the PMOS and NMOS transistors from each other, a groove for trench isolation is formed and then embedded with a silicon oxide layer, thus forming the trench isolation 20. This divides the Si layer 13, the SiGeC layer 14, the SiGe layer 15 and the Si layer 17n into (i) the Si layer 13n, the SiGeC layer 14n, the SiGe layer 15n and the Si layer 17n for the NMOS transistor and (ii) the Si layer 13p, the SiGeC layer 14p, the SiGe layer 15p and the Si layer 17p for the PMOS transistor. Then, the surfaces of the Si layers 17n, 17p are oxidized to form the gate insulating layers 19n, 19p.

At the step shown in FIG. 5 (d), a polysilicon layer is deposited on the whole surface of the substrate and then patterned to form the gate electrodes 18n, 18p on the gate insulating layers 19n, 19p of the NMOS and PMOS transistors. With each of the gate electrodes 18n, 18p used as a mask, phosphorous ions (P+) are injected to form the source-drain layers 16n at the NMOS transistor side and boron ions (B+) are injected to form the source-drain layers 16p at the NMOS transistor side. It is sufficient that the depth of the source-drain layers 16n of the NMOS transistor is deeper than at least the carrier accumulation layer in the SiGeC layer 14n, and that the depth of the source-drain layers 16p of the PMOS transistor is deeper than at least the carrier accumulation layer in the SiGe layer 15p. This is because channels are respectively formed in the carrier accumulation layers in the SiGeC layer 14n and the SiGe layer 15n.

At the step shown in FIG. 5 (e), openings are formed in those portions of the gate insulating layers 19n, 19p above the source-drain layers 16n, 16p.

At the step shown in FIG. 5 (f), the source-drain electrodes 21n, 21p are formed at the openings in the gate insulating layers 19n, 19p.

Thus formed on the Si substrate 10 is an HCMOS device comprising the NMOS and PMOS transistors.

According to the production method of the first embodiment, different channels are required to be formed in the NMOS and PMOS transistors. However, the crystals can simultaneously be grown for both the NMOS and PMOS transistors. Thus, the HCMOS device can readily be produced.

Second Embodiment

According to the first embodiment, a field-effect transistor is formed using a SiGeC layer fitted in lattice for silicon. However, the second embodiment provides a transistor in which, within the range where the crystallinity is not deteriorated, strain is positively induced in a SiGeC layer and changes in band structure due to such strain are utilized. The second embodiment provides an HCMOS device in which the PMOS and NMOS transistors according to the first embodiment in FIG. 1 are realized in a single transistor.

FIG. 6 (a) to FIG. 6 (c) are views respectively illustrating a crystal structure in which compressive strain is induced in the SiGeC layer, a crystal structure in which the SiGeC layer is fitted in lattice for the Si layer (with no strain induced) and a crystal structure in which tensile strain is induced in the SiGeC layer. As shown in FIG. 6 (a), when the lattice constant of the SiGeC layer is larger than that of the Si layer, compressive strain is induced in the SiGeC layer to increase the band gap value between the lower end of the conduction band and the upper end of the valence band in the SiGeC layer. On the other hand, as shown in FIG. 6 (c), when the lattice constant of the SiGeC layer is smaller than that of the Si layer, tensile strain is induced in the SiGeC layer to reduce the band gap between the lower end of the conduction band and the upper end of the valence band in the SiGeC layer. More specifically, the strain of the SiGeC layer causes the band structure to be changed. Thus, such effect can positively be utilized to change the band offset value of the Si layer or the like adjacent to the SiGeC layer.

Even though the lattice constant of the SiGeC layer is shifted from the lattice constant of the Si layer, it is possible to effectively prevent the transistor from being lowered in reliability due to the occurrence of crystal defects such as dislocation or the like, by setting the thickness of the SiGeC layer to such a level that no lattice relaxation occurs and that strain is accumulated.

FIG. 7 (a) and FIG. 7 (b) are, respectively, a view of band structure and a section view of a channel region of the field-effect transistor of the second embodiment. By growing a Si layer 13n on a Si substrate and then growing a SiGeC layer 14n (Ge: 10%, C: 4%) in which the composition rate of C is being increased, the SiGeC layer 14n can be arranged such that its band gap value is large and its lattice constant is small. Then, the thickness of the SiGeC layer 14n is reduced to such an extent that no lattice relaxation occurs and strain is accumulated. Accordingly, tensile strain is induced in the SiGeC layer 14n. In addition to the effect of increasing the band gap value due to an increase in the composition rate of C, the tensile strain in the SiGeC layer 14n increases the band offset value in the conduction band at the interface between the SiGeC layer 14n and the Si layer 13n. This improves the efficiency at which two-dimensional electron gas (2DEG) is confined.

Further, since the SiGeC layer 14n is not relaxed in lattice, the lattice constant of the top thereof is identical with the lattice constant of the Si layer 13n. Accordingly, when a SiGe layer 15p is grown on the SiGeC layer 14n, compressive strain is induced in the SiGe layer 15p because the lattice constant of the SiGe layer 15p is larger than that of the Si layer 13n.

According to the semiconductor device of the second embodiment, tensile strain is induced in the SiGeC layer 14n and compressive strain is induced in the SiGe layer 15p. Accordingly, the band offset value of the conduction band at the interface between the SiGeC layer 14n and the Si layer 13n is large, and the band offset value of the valence band at the interface between the SiGe layer 15p and the Si layer 17p is large. When this transistor is used as an NMOS transistor, a channel formed in the SiGeC layer 14n may be utilized. When this transistor is used as a PMOS transistor, a channel formed in the SiGe layer 15p may be utilized. Thus, there can be formed an HCMOS device having channels different in position, while having a common gate electrode and common source-drain regions.

By properly setting the thickness of each of the layers, there can be obtained an HCMOS device having a field-effect transistor unit which is free from dislocation or defect due to lattice misfit and which is high in reliability resulting from good crystallinity.

The broken lines in FIG. 4 show the composition in which tensile strain of 0.25% is induced in the SiGeC layer 14n in the second embodiment. Generally, when the composition rate of Ge in the SiGeC layer is 8.2 times of the composition rate of C, the SiGeC layer is fitted in lattice for the Si layer. Accordingly, when the composition rate of Ge is smaller than 8.2 times of the composition rate of C, tensile strain can be induced in the SiGeC layer 14n. It is now supposed that the composition rate of C is set to y. When the Ge composition is set to (8.2y−0.12), the lattice constant of the SiGeC layer 14n can be made smaller by 0.25% than that of the Si layer 13n.

As shown in FIG. 4, likewise in the non-strain type, a band discontinuous portion is not formed in the valence band at the interface between the SiGeC layer 14n and the Si layer 13n, and is formed only in the conduction band. When the C concentration is not greater than 2%, the band offset value of the conduction band is substantially equal to that of the non-strain type. Thus, even though the ratio of the C concentration to the Ge concentration deviates from the value satisfying the condition of lattice fit, there can be obtained transistor characteristics substantially equal to those of the lattice-fit type. This means that a certain latitude is allowed in the condition in view of control of C concentration and Ge concentration when growing the SiGeC layer 14n. This facilitate the crystal growth of the SiGeC layer. When the C concentration is not less than 2%, the band offset value can be made greater than in the non-strain type with the same C concentration. It is therefore possible to comply with a circuit requiring a greater band offset value.

The second embodiment is arranged such that the lattice constant of SiGeC is smaller than that of Si. However, since the thickness of the SiGeC layer is set such that no lattice relaxation is induced and strain is accumulated, there is no possibility of the transistor being lowered in reliability due to crystal defect such as dislocation or the like.

Third Embodiment

According to the first embodiment mentioned earlier, there is formed, at the channel region of each field-effect transistor, a heterostructure in which the SiGeC layer is fitted in lattice for the Si layer, and electrons or positive holes are confined in the band discontinuous portion at the heterointerface such that the electrons or positive holes are used as carriers.

According to a third embodiment, there is formed a transistor in which a carrier confining region is not formed at a heterointerface, and in which a quantum well structure of Si/SiGeC or Si/SiGe/Si is formed such that a quantum well (SiGeC, SiGe) held by and between barrier layers serves as a channel.

Figure 8:
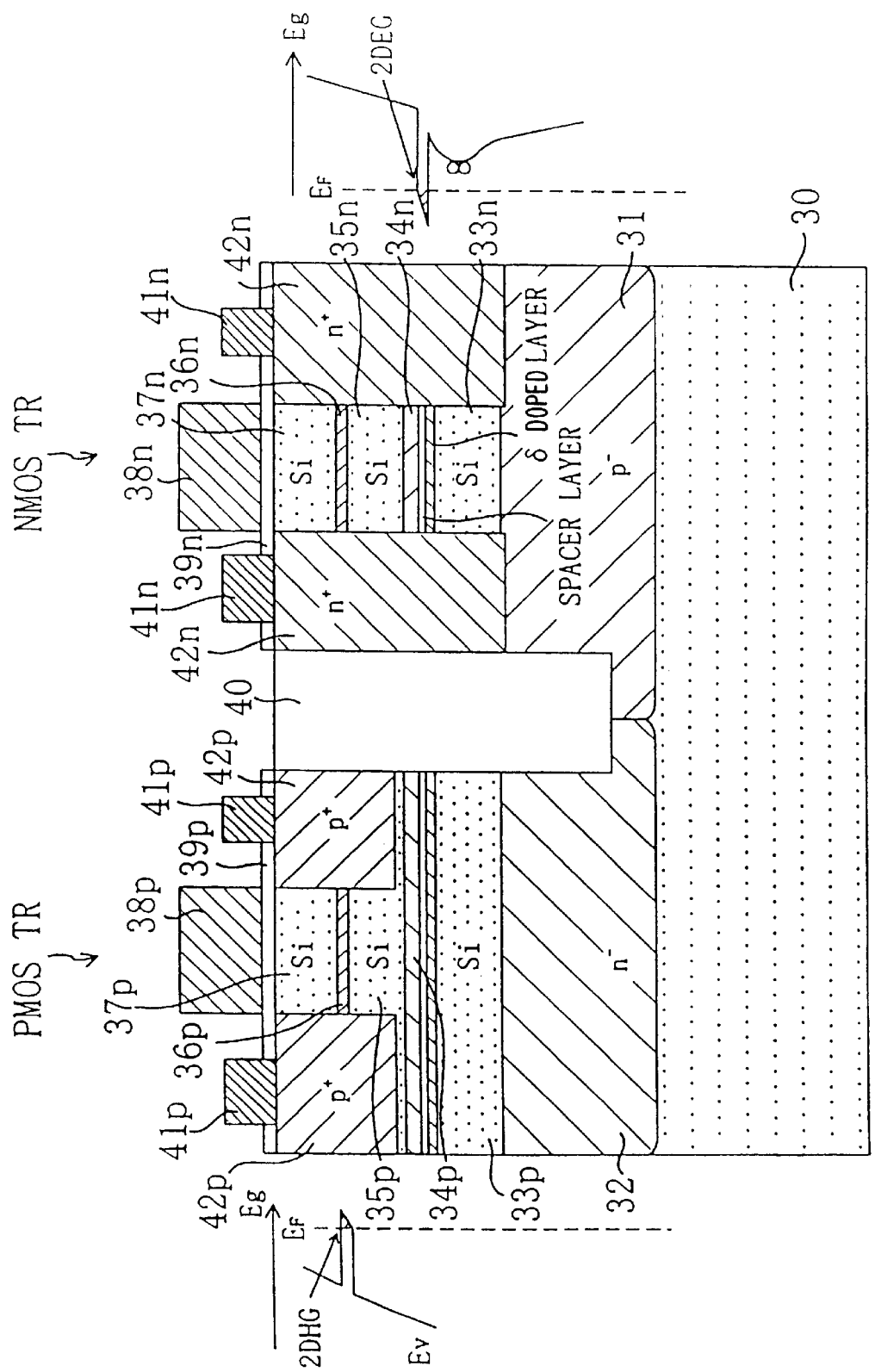
FIG. 8 is a section view illustrating the structure of an HCMOS device having channels each in a quantum well structure according to a third embodiment of the present invention.

FIG. 8 is a section view of an HCMOS device according to the third embodiment. This HCMOS device has a CMOS-device structure in which NMOS and PMOS transistors are formed on a Si substrate 30. This structure in FIG. 8 is the same as that of the HCMOS device in FIG. 1 in that a p-well 31 and an n-well 32 are formed on the Si substrate 30 and that there are respectively formed, on the p- and n-wells 31, 32, first Si layers 33n, 33p each having a δ doped layer doped with a V-family element in high concentration. However, the PMOS and NMOS transistors on the first Si layers 33n, 33p are different from those in the first embodiment.

In the NMOS transistor, a SiGeC layer 34n having such a composition as to fit in lattice for the first Si layer 33n, is formed on the first Si layer 33n, and a second Si layer 35n is laminated on the SiGeC layer 34n. In the third embodiment, a quantum well region (SiGeC layer 34n) held by and between two band discontinuous portions is present in the conduction band extending over the first Si layer 33n, the SiGeC layer 34n and the second Si layer 35n. Accordingly, a carrier accumulation layer for confining two-dimensional electron gas (2DEG) serving as a carrier is formed in the SiGeC layer 34n which is a quantum well region (See the band illustration at the right hand in FIG. 8). More specifically, a channel is formed in the SiGeC layer 34n when the NMOS transistor is operated. A thin SiGe layer 36n and a third Si layer 37n are successively formed on the second Si layer 35n.

According to the arrangement above-mentioned, likewise in the first embodiment, a channel for moving carriers is formed in the SiGeC layer 34n higher in electron mobility than the Si layer. Thus, there can be obtained an NMOS transistor high in operational speed. In addition, since the SiGeC layer 34n serving as a quantum well layer is thin, the third embodiment is improved in carrier confining efficiency as compared with the first embodiment and can be achieved using a layer small in mixed-crystal ratio. This restrains factors of deteriorating the mobility of electrons serving as a carriers. The factors include carrier scattering due to the deterioration in regularity of the crystal structure resulting from mix-crystallization.

The PMOS transistor is the same as the NMOS transistor in that there are successively formed, on the first Si layer 33p, a SiGeC layer 34p having such a composition as to fit in lattice for the first Si layer 33p, a second Si layer 35p, a thin SiGe layer 36p and a third Si layer 37p. In the PMOS transistor, however, there is formed a quantum well region (SiGe layer 36p) held by and between two band discontinuous portions in the valence band extending over the second Si layer 35p, the SiGe layer 36p and the third Si layer 37p, and there is formed, in the quantum well region, a carrier accumulation layer for two-dimensionally confining positive holes serving as carriers. More specifically, when the PMOS transistor is operated, a channel is formed in the SiGe layer 36p. In the SiGe layer 36p, too, the mobility of positive holes is higher than in the Si layer. This enables the PMOS transistor to be operated at a high speed.

In the NMOS and PMOS transistors, gate insulating layers 39n, 39p comprising silicon oxide layers are formed on the substrate, and gate electrodes 38n, 38p are formed on the gate insulating layers 39n, 39p. Source-drain layers 42n, 42p are formed at the both sides of the gate electrodes 38n, 38p, and source-drain electrodes 41n, 41p come in contact with the tops of the source-drain layers 42n, 42p. It is a matter of course that, in the NMOS and PMOS transistors, the respective travels of electrons and positive holes in the SiGeC layer 34n and the SiGe layer 36p are controlled by voltages respectively applied to the gate electrodes 38n, 38p.

Formed between the NMOS and PMOS transistors is a trench isolation 40 formed by embedding an isolation groove with a silicon oxide layer. This trench isolation 40 electrically separates the NMOS and PMOS transistors from each other.

Likewise in the first embodiment, the HCMOS device of the third embodiment has the SiGeC layer 34n which is fitted in lattice for the Si layer and which serves as a quantum well region, and there is formed, in the SiGeC layer 34n, a channel in which electrons travel. The SiGe layer 36p serving as a quantum well region is formed in the PMOS transistor and there is formed in the SiGe layer 36p a channel in which positive holes travel. Accordingly, a high-performance HCMOS can be achieved by integrating the NMOS and PMOS transistors each high in switching speed using a quantum well structure high in carrier confining efficiency.

According to the third embodiment, the HCMOS device may be used for a circuit in which high speed of a transistor is required, while a usual CMOS device formed on a Si substrate may be used for other circuit. Also, the HCMOS device can be integrated with a MOS field-effect transistor directly formed on a Si substrate.

The channels of both the NMOS and PMOS transistors are not necessarily formed in the quantum well regions.

Figure 9:
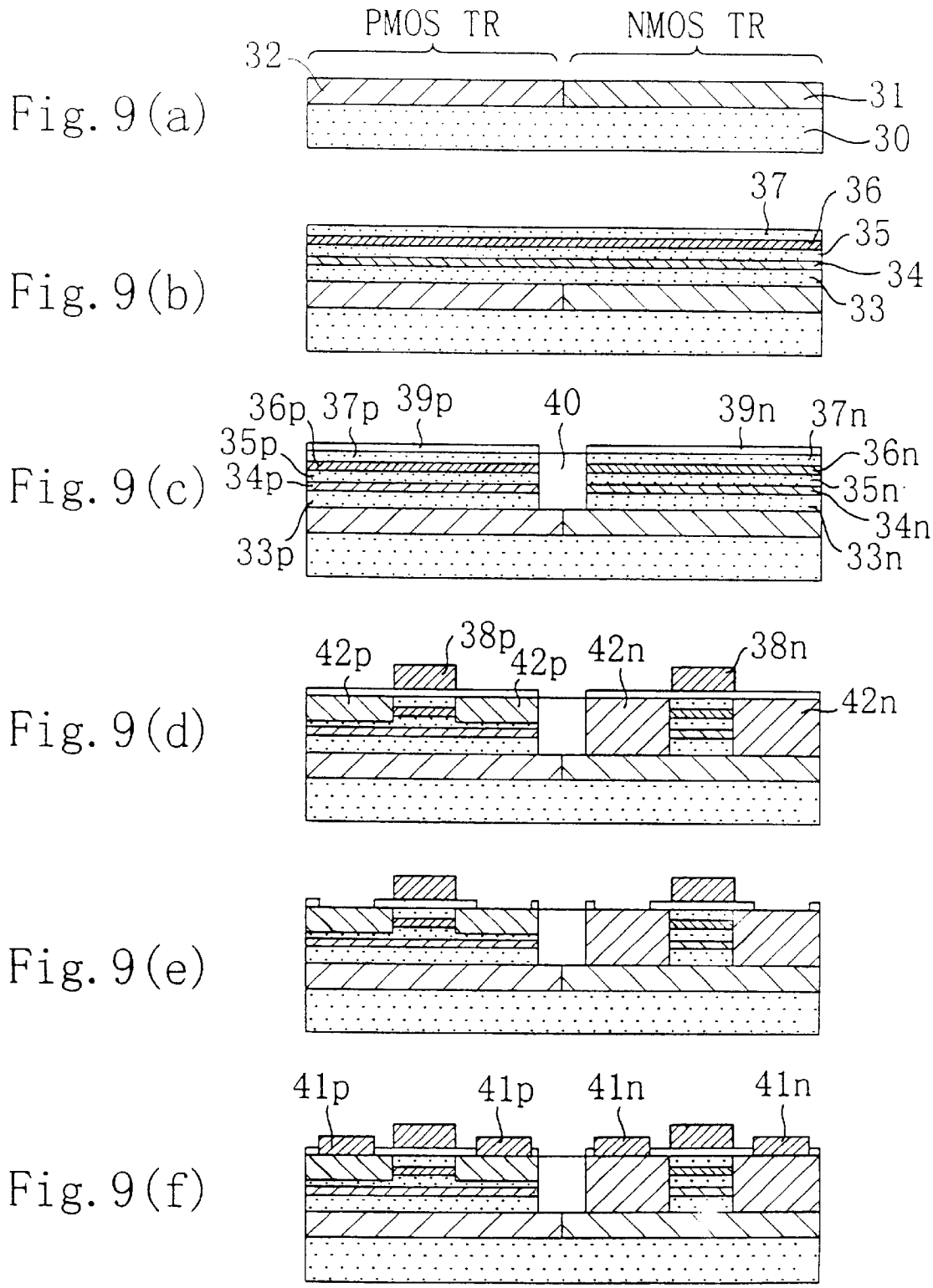
FIG. 9 (a) to FIG. 9 (f) are section views illustrating the steps of producing a semiconductor device according to the third embodiment of the present invention.

Referring to FIG. 9 (a) to FIG. 9 (f), the following description will discuss a method of producing the HCMOS device according to the third embodiment. FIG. 9 (a) to FIG. 9 (f) are section views illustrating an example of a production process for embodying the HCMOS device shown in FIG. 8.

First, an outline of the production process will be given. When growing the SiGeC layer 34, the second Si layer 35 and the SiGe layer 36, the thickness of each of the SiGeC layer 34 and the SiGe layer 36 is made not greater than 10 nm, for example 3 nm, such that each of the layers 34, 36 serves as a quantum well structure. Other portions are formed at steps similar to those shown in FIG. 5 (a) to FIG. 5 (f).

At the step shown in FIG. 9 (a), the p-well 31 and the n-well 32 are formed on the Si substrate 30 by ion injection.

At the step shown in FIG. 9 (b), there are successively grown, on the p- and n-wells 31, 32, a first Si layer 33 including a δ doped layer, a SiGeC layer 34 (Ge: 36%, C:

4%), a second Si layer 35, a SiGe layer 36 and a third Si layer 37, using a UHV-CVD method.

At the step shown in FIG. 9 (c), to electrically separate the PMOS and NMOS transistors, a trench isolation groove is formed and then embedded with a silicon oxide layer for forming the trench isolation 40. This divides the first Si layer 33, the SiGeC layer 34, the second Si layer 35, the SiGe layer 36, the third Si layer 37 and the gate insulating layer 39, into (i) the first Si layer 33n, the SiGeC layer 34n, the second Si layer 35n, the SiGe layer 36n and the third Si layer 17n for the NMOS transistor and (ii) the first Si layer 33p, the SiGeC layer 34p, the second Si layer 35p, the SiGe layer 36p and the third Si layer 37p for the PMOS transistor. Then, the surfaces of the third Si layers 37n, 37p are oxidized to form the gate insulating layers 39n, 39p.

At the step shown in FIG. 9 (d), the gate electrodes 38n, 38p are formed. Then, the source-drain regions 42n are formed by injection of phosphorous ions (P+) for the NMOS transistor, and the source-drain regions 42p are formed by injection of boron ions (B+) for the PMOS transistor. It is sufficient that the depth of the source-drain regions 42n of the NMOS transistor is deeper than the depth of at least the SiGeC layer 34n and that the depth of the source-drain regions 42p of the PMOS transistor is deeper than the depth of at least the SiGe layer 36p. This is because channels are respectively formed in the SiGeC layer 34n and the SiGe layer 36p.

At the step shown in FIG. 9 (e), the gate insulating layers 39n, 39p are patterned to form openings in those portions of the gate insulating layers 39n, 39p above the source-drain regions 42n, 42p.

At the step shown in FIG. 9 (e), the source-drain electrodes 41n, 41p are formed at the openings thus formed.

With the steps above-mentioned, there is formed an HCMOS device comprising the NMOS and PMOS transistors according to the third embodiment.

According to the production method of the third embodiment, there is readily formed an HCMOS device in which the channel in the NMOS transistor is formed by the SiGeC layer 34n of the quantum well structure utilizing a heterojunction, and in which the channel in the PMOS transistor is formed by the SiGeC layer 36p of the quantum well structure utilizing a heterojunction. Further, according to the production method of the third embodiment, different channels are required to be formed for the NMOS and PMOS transistors. However, crystals can simultaneously be grown for both the NMOS and PMOS transistors. Thus, the HCMOS device can readily be produced.

Fourth Embodiment

Figure 10:
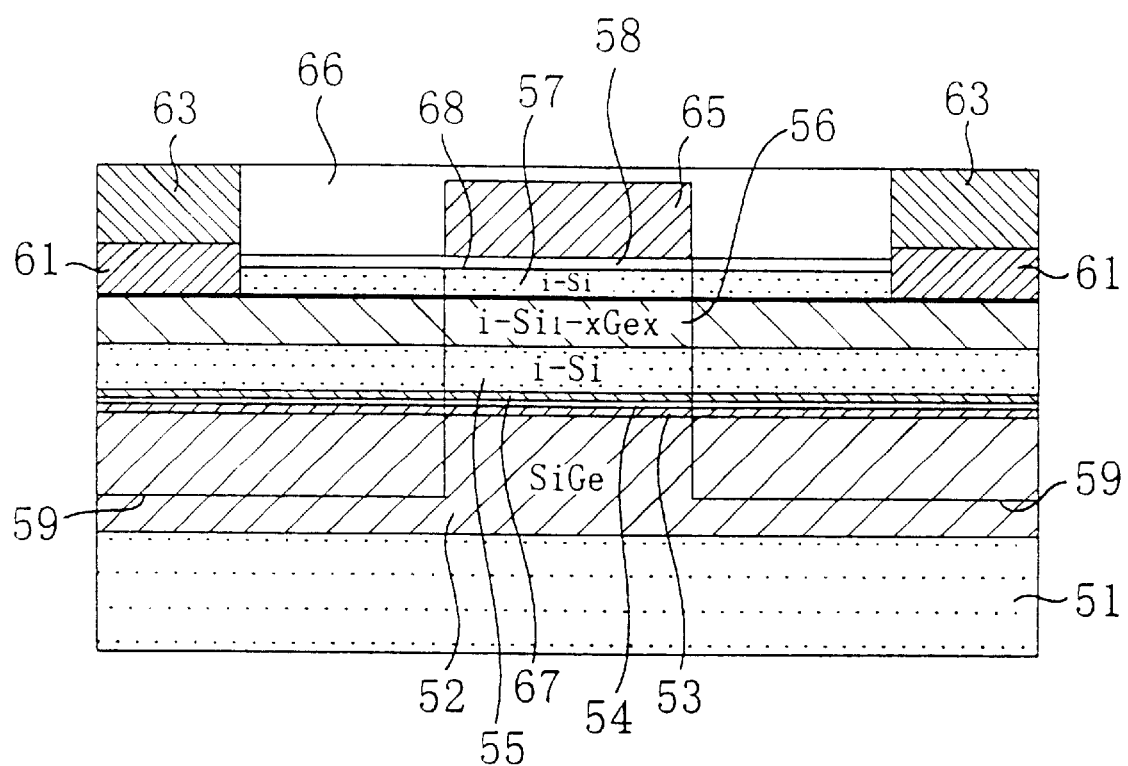
FIG. 10 is a section view illustrating the structure of an HCMOS device according to a fourth embodiment of the present invention.
Figure 11A:
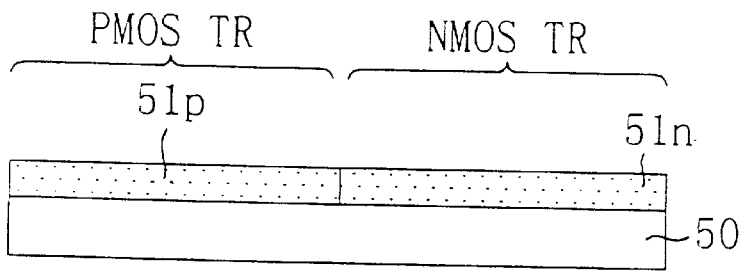
FIG. 11 (a) to FIG. 11 (e) are section views illustrating the first half of the steps of producing the HCMOS device according to the fourth embodiment of the present invention.
Figure 11B:
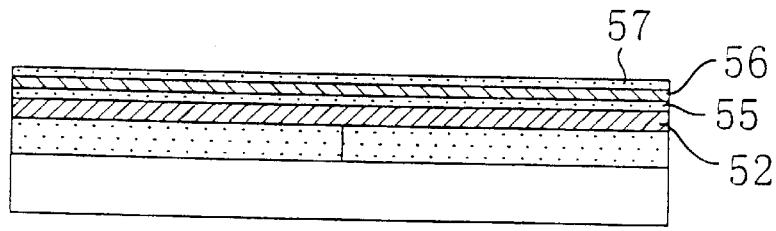
Figure 11C:
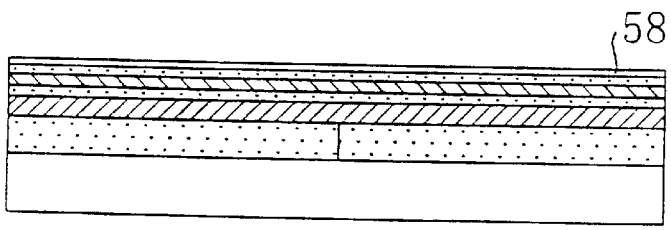
Figure 11D:
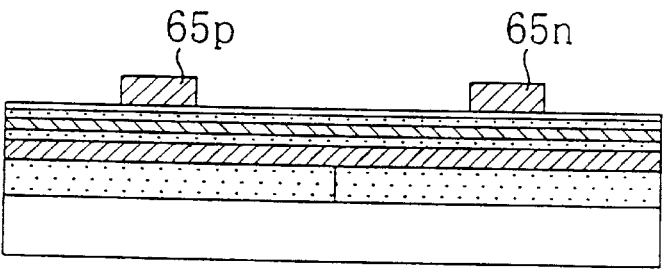
Figure 11E:
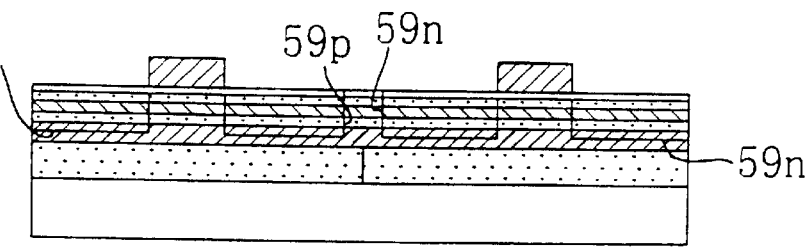

FIG. 10 is a section view illustrating the structure of a field-effect transistor according to a fourth embodiment of the present invention. This fourth embodiment provides a structure having a source-drain contact suitable for a heterojunction field-effect transistor.

As shown in FIG. 10, there are formed, on a well 51 made of a Si layer, a SiGe buffer layer 52, a δ doped layer 53, a spacer layer 54, an n-channel layer 67, an i-Si layer 55, an i-Si$_{1-x}$Ge$_x$ layer 56, an i-Si layer 57 and a gate insulating layer 58. A gate electrode 65 is formed on the gate insulating layer 58. Source-drain contact W layers 61 and Al source-drain electrodes 63 are successively formed on the i-S$_{1-x}$Ge$_x$ layer 56 at both lateral sides of the gate electrode 65. At both sides of the gate electrode 65, source-drain regions 59 are formed as extending over a portion of the SiGe buffer layer 52, the δ doped layer 53, the spacer layer 54, the n-channel layer 67, the i-Si layer 55, the i-Si$_{1-x}$Ge$_x$ layer 56 and the i-Si layer 57. A first insulating layer 66 is embedded in the space between the gate electrode 65 and the Al source-drain electrodes 63.

The following description will discuss the structure of the field-effect transistor above-mentioned.

In the SiGe buffer layer 52, the Ge concentration is increased in the vertical direction from the lower end of the layer 52 toward the upper end thereof. The SiGe buffer layer 52 has a thickness sufficient to relax the SiGe mixed crystal in lattice and therefore has a lattice constant larger than that of Si. Thus, using a strain effect, an n-channel can be formed on the SiGe buffer layer 52. When, without using such a SiGe buffer layer relaxed in lattice, there is formed a heterojunction of Si and SiGe layers with the Si layer fitted in lattice for the Si substrate, a great discontinuous portion increased in level difference is formed in the valence band, but a discontinuous portion is hardly formed in the conduction band. It is therefore difficult to confine two-dimensional electron gas to form an n-channel.

The Ge concentration in the SiGe buffer layer 52 changes, for example, from 0% to 30% continuously or gradually in steps of thin layer portions. At this time, provision is made such that lattice relaxation occurs in each layer portion and that the lattice constant of the SiGe buffer layer 52 at its top layer portion is identical with the lattice constant of the original single crystal Si$_{0.7}$Ge$_{0.3}$. The object of changing the concentration in the vertical direction of the layer 52, is to minimize the influence of a crystal defect exerted on a channel thereon, the crystal defect including dislocation or the like caused by lattice relaxation. The entire thickness of the SiGe buffer layer 52 is required to be about 1 μm.

Formed on the SiGe buffer layer 52 is the spacer layer 54 made of Si$_{0.7}$Ge$_{0.3}$ including no impurity. A carrier accumulation layer is formed at a discontinuous portion of a conduction band which is formed at the heterointerface between the spacer layer 54 and the i-Si layer 55 thereon. This carrier accumulation layer serves as the n-channel 67 in which electrons are two-dimensionally confined.

The δ doped layer 53 is a layer doped with a V-family element such as P or As in high concentration for supplying electrons serving as carriers to the n-channel 67. The spacer layer 54 on the δ doped layer 53 is composed of Si$_{0.7}$Ge$_{0.3}$ doped with no impurity, and spatially separates the carrier electrons in the n-channel 67 from the ions in the δ doped layer 53 from each other. This lowers the scattering of the carrier electrons by the ions, thus improving the mobility. As the spacer layer 54 is increased in thickness, the carrier scattering effect by ionized impurity is lowered. However, as the spacer layer 54 is increased in thickness, the carrier density is lowered. Therefore, the thickness of the spacer layer 54 is preferably set to about 3 nm.

The i-Si$_{1-x}$Ge$_x$ layer 56 and the i-Si layer 57 form a level difference in the valence band at the heterointerface to form a p-channel 68. Here, x is preferably set to about 0.7.

The gate insulating layer 58 insulates the gate electrode 65 from the semiconductor layer therebelow to lower the gate leakage current, thus enabling the transistor to be lowered in power consumption. An oxide layer formed by oxidizing the i-Si$_{1-x}$Ge$_x$ layer 56 is water-soluble and unsteady. Therefore, in the SiGe field-effect transistor, too, a silicon oxide layer is preferably used as a gate insulating layer. In a Si heterojunction MOS device, therefore, the semiconductor layer immediately below the gate insulating layer is preferably a Si layer.

More specifically, each of the field-effect transistors according to the fourth embodiment comprises a channel region formed by the lamination layers above-mentioned, the source-drain regions 59 shown by the broken lines in FIG. 10, the Al source-drain electrodes 63 for introducing and taking out an electric current for operating the transistor, and the gate electrode 65 for applying a voltage for controlling the electric current. When this field-effect transistor is to be used as an n-channel field-effect transistor, a voltage is applied to the gate electrode 65 such that the n-channel 67 is formed. When this field-effect transistor is to be used as a p-channel field-effect transistor, a voltage is applied to the gate electrode 65 such that the p-channel 68 is formed.

The fourth embodiment is characterized by comprising channel regions, source-drain regions and source-drain contact layers. The channel regions comprise a first semiconductor layer including a $Si_{1-x-y}Ge_xC_y$ layer ($0 \leq x \leq 1$, $0 \leq y \leq 1$), a second semiconductor layer different in band gap from the first semiconductor layer, and a carrier accumulation layer formed in the vicinity of the interface between the first and second semiconductor layers. The source-drain regions comprise a third semiconductor layer and a fourth semiconductor layer greater in band gap than the third semiconductor layer. The source-drain contact layers are made of conductive layers which are low in resistance and which are formed immediately above the third semiconductor layer.

When using the field-effect transistor according to the fourth embodiment as an n-channel field-effect transistor, the i-Si layer 55 serves as the first semiconductor layer (x=y=0) including a $Si_{1-x-y}Ge_xC_y$ layer ($0 \leq x \leq 1$, $0 \leq y \leq 1$), the SiGe buffer layer 52 serves as the second semiconductor layer, the i-$Si_{1-x}Ge_x$ layer 56 serves as the third semiconductor layer, the i-Si layer 57 serves as the fourth semiconductor layer greater in band gap than the i-$Si_{1-x}Ge_x$ layer 56, and the source-drain contact W layers 61 are formed immediately above the i-$Si_{1-x}Ge_x$ layer 56 serving as the third semiconductor layer.

When using the field-effect transistor according to the fourth embodiment as a p-channel field-effect transistor, the i-$Si_{1-x}Ge_x$ layer 56 serves as the first semiconductor layer (y=0) including a $Si_{1-x-y}Ge_xC_y$ layer ($0 \leq x \leq 1$, $0 \leq y \leq 1$) and also as the third semiconductor layer, the i-Si layer 57 serves as the second semiconductor layer and also as the fourth semiconductor layer greater in band gap than the third semiconductor layer, and the source-drain contact W layers 61 are formed immediately above the i-$Si_{1-x}Ge_x$ layer 56 serving as the third semiconductor layer.

As discussed in the foregoing, this embodiment is arranged such that those regions of the substrate which come in contact with the Al source-drain electrodes 63, are formed in a semiconductor layer which is smaller in band gap out of the semiconductor layers for forming a channel. The fourth embodiment is arranged such that, at the heterointerface between the i-Si layer 57 and the i-$Si_{1-x}Ge_x$ layer 56 for forming the p-channel, the source-drain contact W layers 61 are formed immediately above the i-$Si_{1-x}Ge_x$ layer 56 smaller in band gap. As compared with the arrangement in which the source-drain contact W layers 61 are formed immediately above the uppermost semiconductor layer or i-Si layer 57, this reduces the contact resistance, enabling the transistor to be operated at a high speed with lower power consumption.

When metal (Al in this case) is deposited after W has been grown on the $Si_{0.7}Ge_{0.3}$ layer on the Si layer, contacts very low in resistance can be obtained. Such contacts using the SiGe layer are lower in resistance by one digit than low-resistance contacts obtained using a silicide technology which are generally used as low-resistance contacts in a CMOS device of prior art (IEEE Electron Device Letters, Vol. 17, No. 7, 1996 pp 360).

According to the paper above-mentioned, the SiGe layer is grown for forming source-drain electrode contacts. However, when the contacts are formed on the SiGe layer for channel formation as done in the fourth embodiment, it is not required to newly grow a SiGe crystal to improve the productivity, as will be apparent in the transistor producing method to be discussed later.

According to the fourth embodiment, the HCMOS device may be used for a circuit in which high speed of a transistor is required, while a usual CMOS device formed on a Si substrate may be used for other circuit. Such HCMOS device can be integrated with a MOS field-effect transistor directly formed on a Si substrate.

The following description will discuss a method of producing the field-effect transistor according to the fourth embodiment. FIG. 11 (a) to FIG. 11 (e) and FIGS. 12 (a) to (e) are section views illustrating an example of the steps of producing the field-effect transistor shown in FIG. 10.

At the step shown in FIG. 11 (a), prior to epitaxial growth for channel formation, the p- and n-wells 51n, 51p serving as the groundworks of NMOS and PMOS transistors are formed on a silicon substrate 50 by ion injection.

At the step shown in FIG. 11 (b), prior to epitaxial growth on the substrate, the substrate is cleaned using an RCA cleaning method or the like, thereby to remove impurity on the surface. Thereafter, the surface oxide layer is removed and the substrate is then inserted into an epitaxial growth apparatus. In a vacuum, the substrate is heated to obtain a clean surface. Through epitaxial growth, semiconductor layers for forming a channel region are formed on the clean surface. These semiconductor layers include the SiGe buffer layer 52, the δ doped layer 53, the spacer layer 54, the n-channel 67, the i-Si layer 55, the i-$Si_{1-x}Ge_x$ layer 56, the p-channel 68, the i-Si layer 57 and the like. For convenience' sake, the δ doped layer 53, the spacer layer 54, the n-channel 67 and the p-channel 68 are not shown. The following description will discuss how the respective semiconductor layers are formed.

As a method of growing semiconductor layers, there can be used an MBE method using a solid source and a UHV-CVD method using a gas source. According to the UHV-CVD method, the atmosphere in the apparatus is first brought to a super-low gas pressure (about $10^{-10}$ Torr). After a source necessary for crystal growth is introduced into the vacuum container, a crystal is grown in a vacuum when the degree of vacuum reaches about $10^{-5} \sim 10^{-6}$ Torr.

According to the fourth embodiment, too, when the degree of vacuum in the vacuum container becomes sufficiently low after a clean surface is formed on the substrate by the method above-mentioned, the substrate temperature is set to about 500~about 700° C. for growth of semiconductor crystal layers. Changes in substrate temperature exert an influence upon the crystal quality such as changes in composition rate of a single semiconductor crystal layer. Accordingly, the substrate temperature is basically not changed while a single layer is being grown. When the substrate temperature becomes not less than 800° C., inter-diffusion of Ge and Si occurs. This is disadvantageous in view of deterioration in sharpness and strain relaxation to deteriorate the channel characteristics. Therefore, the growth temperature is set to not greater than 700° C. as mentioned earlier.

Crystal growth is conducted by introducing source gas necessary for crystal growth into a vacuum container brought to a super-low gas pressure. As the source gas for crystal growth, disilane is used for growth of a Si layer. For growing a SiGe layer, germane is used as a Ge source gas in addition to the source gas such as disilane for growing a Si layer. At this time, by adjusting the ratio of partial pressures of the respective source gases, the composition rates of Si and Ge in the SiGe layer can be controlled. The gas flow amount is adjusted such that the degree of vacuum is in the range of about $10^{-5}$~about $10^{-6}$ Torr.

First, a plurality of SiGe layer portions in which the composition rates are being gradually changed and which are being relaxed in lattice, are laminated to form the SiGe buffer layer 52. To gradually change the composition rate, the ratio of the partial pressures of the Si source gas and the Ge source gas is gradually changed.

To form the δ doped layer 53, a dopant gas such as arsine or phosphine is introduced into the vacuum container together with disilane and germane.

If impurity introduced into the δ doped layer 53 is mixed with the spacer layer 54, the transistor is deteriorated in characteristics. Accordingly, after the dopant gas is introduced into the vacuum container, the supply of the source gas is once stopped. After the degree of vacuum is sufficiently lowered, the gas for growing the spacer layer 54 is then introduced for growing the spacer layer 54. Provision is made such that the spacer layer 54 has a uniform composition of $Si_{0.7}Ge_{0.3}$. The spacer layer 54 is grown with the disilane and germane flow amounts fixed.

After the growth of the spacer layer 54, the supply of the source gas is stopped. After the degree of vacuum is sufficiently lowered, only disilane is introduced into the growth chamber for growing the i-Si layer 55 doped with no impurity.

After the growth of the i-Si layer 55, disilane and germane are again introduced into the growth chamber for growing the $i-Si_{1-x}Ge_x$ layer 56. The Ge concentration is set to 70%. After the growth of the $i-Si_{1-x}Ge_x$ layer 56, the supply of the source gas is once stopped. Then, after the degree of vacuum is sufficiently lowered, only disilane is introduced into the growth chamber for growing the i-Si layer 57.

With the foregoing, the process of epitaxially growing the semiconductor layers forming a channel region is finished.

At the step shown in FIG. 11 (c), the substrate is taken out from the UHV-CVD apparatus and introduced into a thermal oxidation furnace where the surface of the uppermost i-Si layer 57 is oxidized to form the gate insulating layer 58 made of a silicon oxide layer.

At the step shown in FIG. 11 (d), gate electrodes 65n, 65p are formed on the gate insulating layer 58. The gate electrodes 65n, 65p are formed in a manner similar to that in a CMOS device of prior art. More specifically, a polysilicon layer is deposited and, after impurity is introduced by ion injection, the polysilicon layer is patterned to form the gate electrodes 65n, 65p by dry-etching. Ions of boron fluoride (BF 2+) can be used as impurity ions. At the stage where the polysilicon layer for gate electrodes is deposited, the source-drain regions are not formed yet.

At the step shown in FIG. 11 (e), with the gate electrodes 65n, 65p serving as masks, impurity ions serving as a dopant are injected into the substrate to form the source-drain regions 59n, 59p. Then, etching is conducted to remove the oxide layer exposed onto the substrate for forming contacts. At the time of ion injection, the ion accelerating voltage is selected such that the peak of impurity distribution is located in the contact layers which come in contact with source-drain electrodes. As impurity ions to be injected, ions of arsenic (As+) or phosphorous (P+) of the n-type impurity are used for the NMOS transistor region, and boron ions (B+) of the P-type impurity are used for the PMOS transistor region. It is therefore required to conduct, using respectively different masks, ion injection for forming the source-drain regions 59n for the NMOS transistor and ion injection for forming the source-drain regions 59p for the PMOS transistor.

Immediately after ion injections, an annealing processing is executed for activating the impurity. It is however preferable to execute RTA (rapid thermal annealing) for a short period of time (30 seconds) at about 1000° C. such that no interdiffusion of Si and Ge occurs at the heterointerface and that no defect is induced in a crystal in the course of relaxation of strain present in the Si/SiGe type.

At the step shown in FIG. 12 (a), a photoresist mask (not shown) is formed again on the substrate and the region between the NMOS transistor forming region and the PMOS transistor forming region is excavated in depth deeper than at least the channel region, thus forming a transistor isolation groove 71.

At the step shown in FIG. 12 (b), a first insulating layer 72 is deposited on the entire surface of the substrate including the groove 71. To avoid the execution of a high-temperature process, it is preferable to use a TEOS layer or the like which can be formed at a temperature of not greater than 500° C. using a plasma CVD method. At this time, a trench isolation 73 is formed by the insulating layer embedded in the groove 71.

The source-drain contacts which constitute a characteristic feature of the fourth embodiment, are then formed in the following steps. However, the steps of forming the structure in FIG. 10 are not limited to the following steps.

To maximize the effect produced by the fourth embodiment, there is required the presence of a specific very thin semiconductor layer which ultimately serves as the ground of the contacts. In this connection, $i-Si_{1-x}Ge_x$ layers 56n, 56p are selected as the specific semiconductor layer serving as the ground, and the substrate is etched until the $i-Si_{1-x}Ge_x$ layers 56n, 56p are exposed. To expose the $i-Si_{1-x}Ge_x$ layers 56n, 56p, it is preferable to apply wet-etching high in selectivity. However, the wet-etching is poor in anisotropy and is not suitable for micro-machining. It is therefore preferable to execute wet-etching after executing dry-etching to selectively remove those regions of the first insulating layer 72 at which source-drain electrodes will be formed, thus forming contact holes to cause gate insulating layers 58n, 58p to be exposed. The following steps may be conducted as an example of such a process.

To remove the uppermost oxide layer (gate insulating layers 58n, 58p), a solution of the hydrofluoric acid type is used as well known. When i-Si layers 57n, 57p are exposed, the etchant of the hydrofluoric acid type which hardly removes silicon, is changed to an etchant capable of removing the i-Si layers 57n, 57p. According to the fourth embodiment, contacts are formed in the $i-Si_{1-x}Ge_x$ layers 56n, 56p below the i-Si layers 57n, 57p. Accordingly, there is selected an etchant which hardly etches the $i-Si_{1-x}Ge_x$ layers 56n, 56p but selectively etches the i-Si layers 57n, 57p. Using this etchant, the i-Si layers 57n, 57p are removed and the $i-Si_{1-x}Ge_x$ layers 56n, 56p are exposed. At this time, portions of the $i-Si_{1-x}Ge_x$ layers 56n, 56p may be removed due to over-etching. As mentioned earlier, the $i-Si_{1-x}Ge_x$ layers 56n, 56p are formed through epitaxial growth for forming an n-channel in the channel region of the NMOS transistor. Accordingly, the fourth embodiment eliminates a step of growing new $i-Si_{1-x}Ge_x$ layers 56n, 56p for forming contacts low in resistance using SiGe layers.

To form contacts, a metallic layer low in resistance is deposited on the exposed $i-Si_{1-x}Ge_x$ layers 56n, 56p. When tungsten (W) is used as the metallic material of the metallic layer, there can be formed contacts extremely low in resistance. According to the fourth embodiment, with the temperature set to 400° C., source-drain contact W layers 61n, 61p are selectively grown on the $i-Si_{1-x}Ge_x$ layers 56n, 56p using, as a source gas, gas obtained by diluting WF6 by hydrogen.

At the step shown in FIG. 12 (e), the substrate is subjected to sputtering to cause an Al alloy layer to be deposited on the whole surface of the substrate, and is then patterned to form Al source-drain electrodes 63n, 63p. With the steps above-mentioned, contacts low in resistance can be formed on the source-drain regions.

As mentioned earlier, a Si heterojunction MOS device uses a silicon oxide layer as a gate insulating layer. Accordingly, the uppermost semiconductor layer is preferably a Si layer having a great band gap. Thus, the technology of forming a contact metallic layer after a semiconductor layer has been removed as done in the fourth embodiment, is particularly suitable for forming a Si heterojunction MOS device.

Fifth Embodiment

In the fourth embodiment, there is taken, as a representative example, a channel structure using a heterojunction of Si and SiGe. The invention in which contacts low in resistance are formed in source-drain regions of an HCMOS device, is not limited to the fourth embodiment. According to the invention, there may be used a channel formed between Si and a heteroepitaxial lamination layer having a structure other than the lamination structure of SiGe in the fourth embodiment. For example, there may be used a channel formed between Si and a mixed crystal semiconductor of $Si_{1-x-y}Ge_xC_y$ ($0 \leq x \leq 1$, $0 \leq y \leq 1$). To form a channel at the heterointerface, two kinds of semiconductors different in band gap are always required. Accordingly, the formation of such a contact layer low in resistance is effective.

Figure 13:
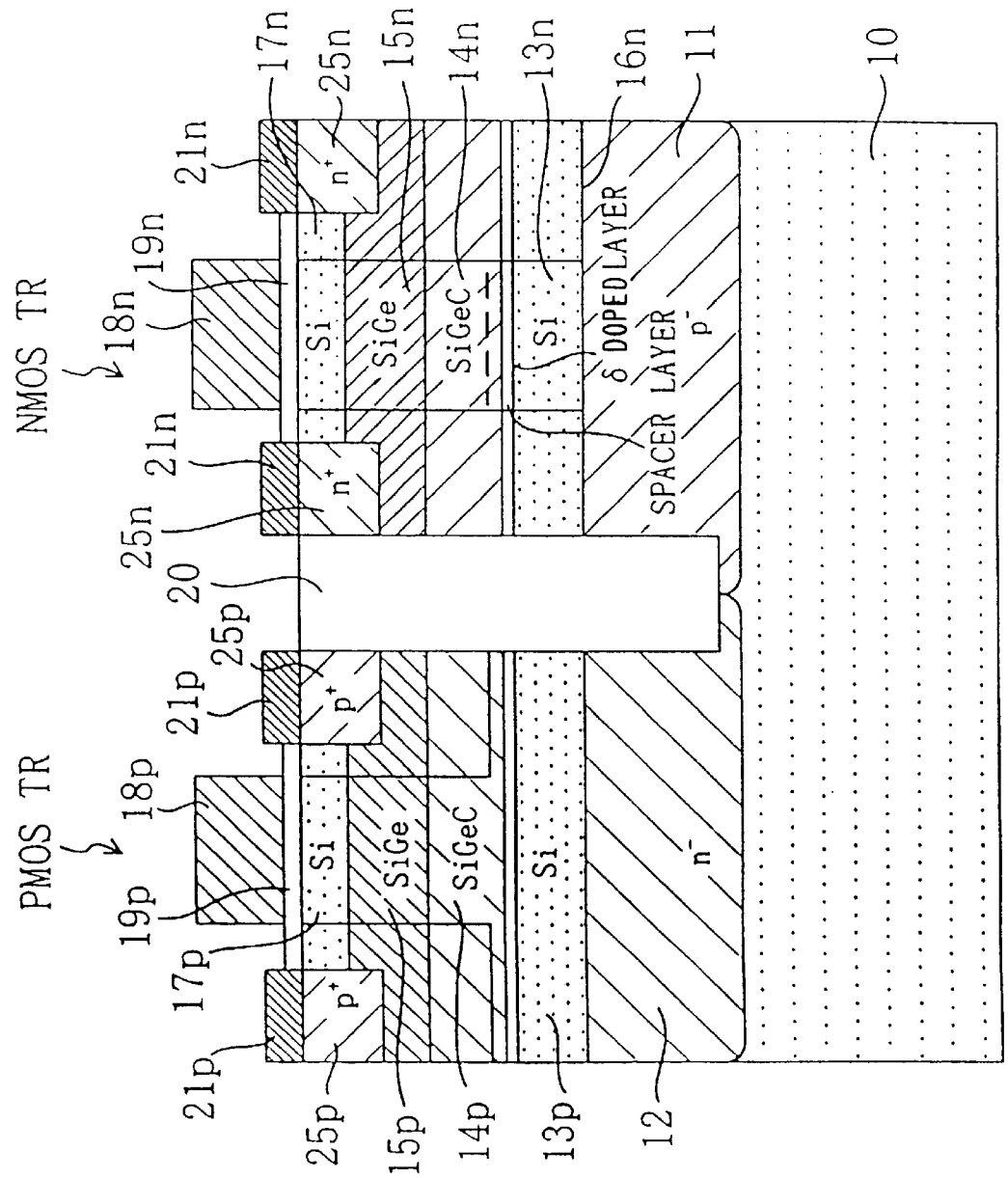
FIG. 13 is a section view illustrating the structure of an HCMOS device according to a fifth embodiment of the present invention.

FIG. 13 is a section view of an HCMOS device according to a fifth embodiment in which metallic contact layers low in resistance are formed in the structure shown in FIG. 1.

As shown in FIG. 13, the HCMOS device of the fifth embodiment has source-drain contact W layers 25n, 25p on SiGe layers 15n, 15p.

Likewise the fourth embodiment, the fifth embodiment has the following characteristic feature in addition to the characteristic features of the first embodiment. That is, the fifth embodiment comprises channel regions, source-drain regions and source-drain contact layers. The channel regions comprise a first semiconductor layer including a $Si_{1-x-y}Ge_xC_y$ layer ($0 \leq x \leq 1$, $0 \leq y \leq 1$), a second semiconductor layer different in band gap from the first semiconductor layer, and a carrier accumulation layer formed in the vicinity of the interface between the first and second semiconductor layers. The source-drain regions comprise a third semiconductor layer and a fourth semiconductor layer greater in band gap than the third semiconductor layer. The source-drain contact layers are made of conductive layers which are low in resistance and which are formed immediately above the third semiconductor layer.

In the NMOS transistor in the fifth embodiment, a SiGeC layer 14n serves as the first semiconductor layer including a $Si_{1-x-y}Ge_xC_y$ layer ($0 \leq x \leq 1$, $0 \leq y \leq 1$), a Si layer 13n serves as the second semiconductor layer, the SiGe layer 15n serves as the third semiconductor layer, a Si layer 17n serves as the fourth semiconductor layer greater in band gap than the SiGe layer 15n, and the source-drain contact W layer 25n is formed immediately above the SiGe layer 15n serving as the third semiconductor layer.

In the PMOS transistor of the fifth embodiment, the SiGe layer 15p serves as the first semiconductor layer (y=0) including a $Si_{1-x-y}Ge_xC_y$ layer ($0 \leq x \leq 1$, $0 \leq y \leq 1$) and also as the third semiconductor layer, a Si layer 17p serves as the second semiconductor layer and also as the fourth semiconductor layer greater in band gap than the third semiconductor layer, and a source-drain contact W layer 25p is formed immediately above the SiGe layer 15p serving as the third semiconductor layer.

As discussed in the foregoing, this embodiment is arranged such that those regions (source-drain contact W layers 25n, 25p) of the substrate which come in contact with the Al source-drain electrodes 21n, 21p, are formed in a semiconductor layer which is smaller in band gap out of the semiconductor layers for forming a channel. This reduces the contact resistance as compared with the arrangement in which the contacts are formed immediately above the uppermost Si layers 17n, 17p. Thus, the device can be operated at a high speed with lower power consumption.

In particular, the source-drain contact W layers 25n, 25p made of tungsten (W) are so formed as to come in contact with the SiGe layers 15n, 15p. Thus, the source-drain contact W layers 25n, 25p are extremely low in contact resistance.

That is, the fifth embodiment can be arranged to lower the contact resistance, yet producing the effects produced by the first embodiment.

Sixth Embodiment

Figure 14:
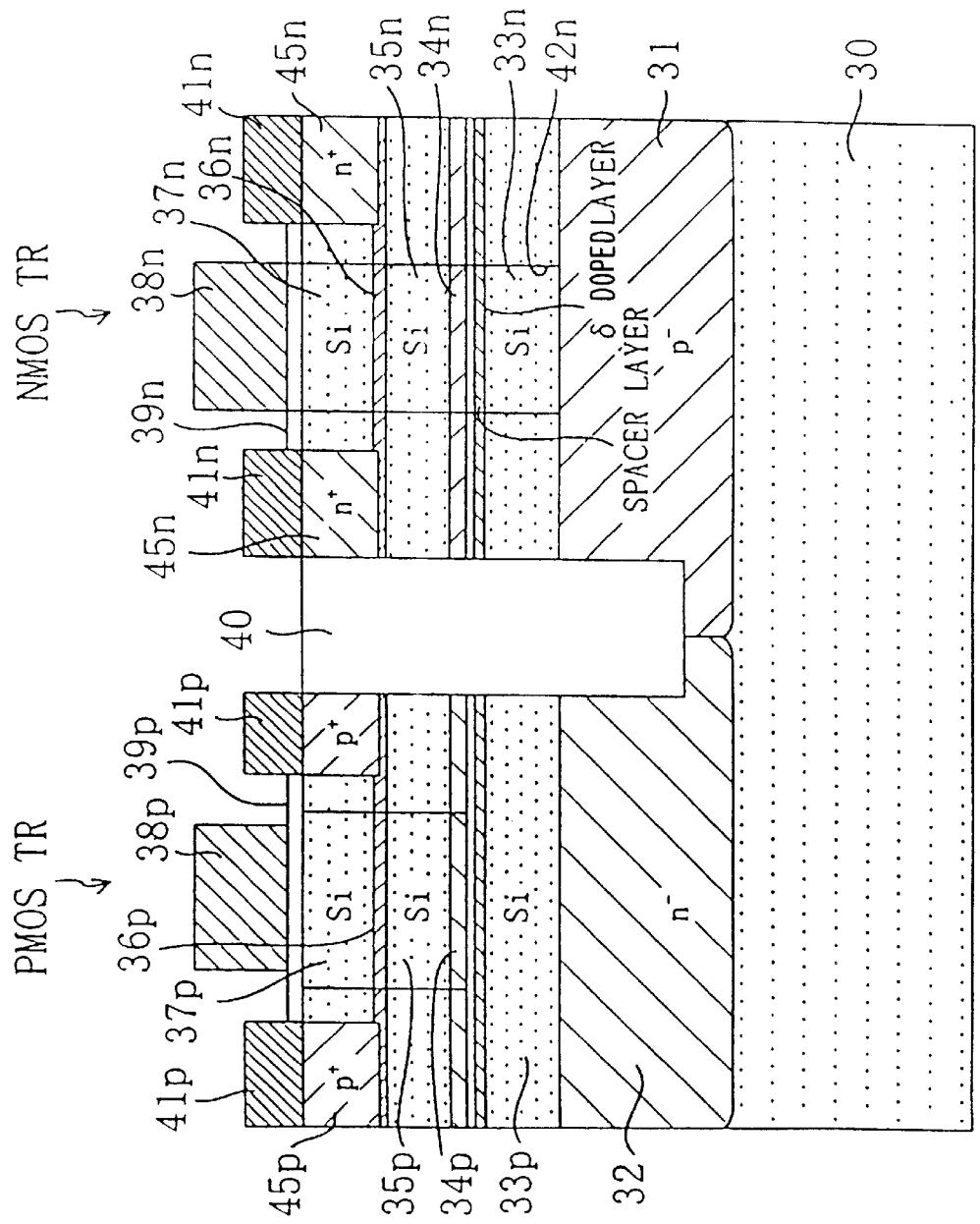
FIG. 14 is a section view illustrating the structure of an HCMOS device according to a sixth embodiment of the present invention.
Figure 15:
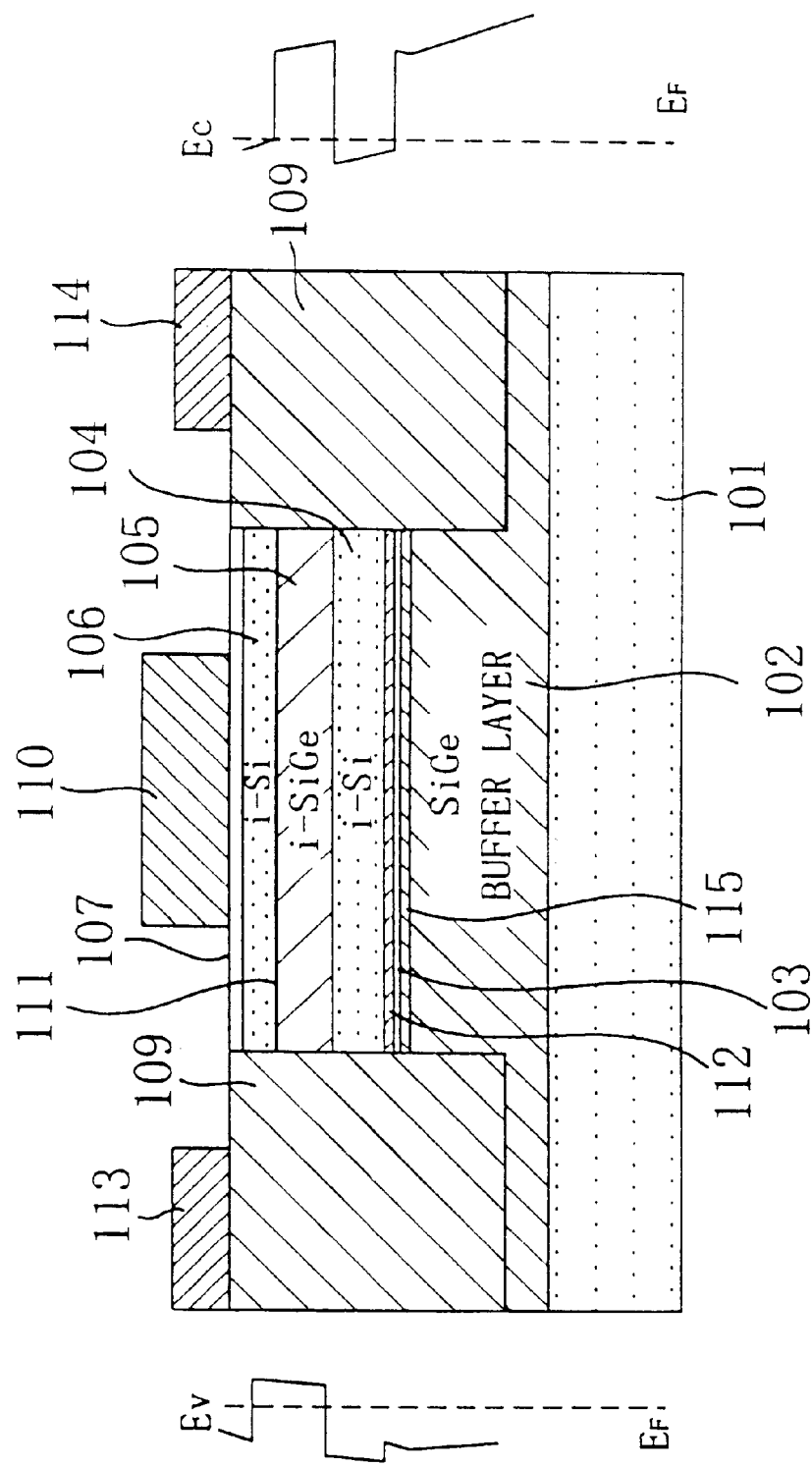
FIG. 15 is a section view illustrating the structure of an HCMOS device of prior art.
Figure 16:
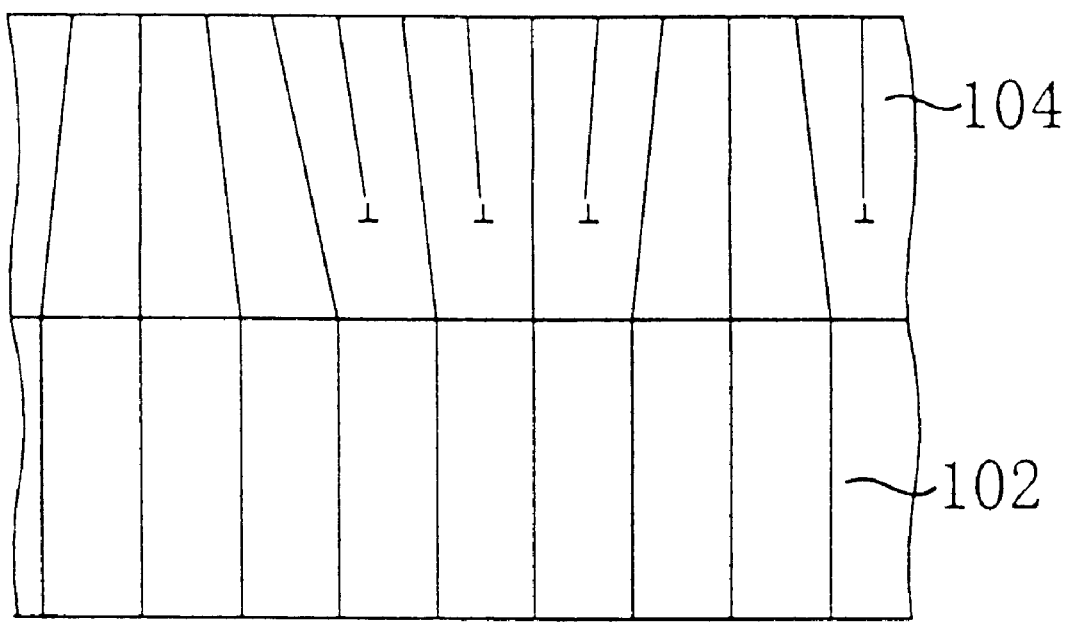
FIG. 16 shows defects induced in a heterointerface of the HCMOS device of prior art in FIG. 15, the defects including dislocation or the like produced by strain due to lattice misfit.

FIG. 14 is a section view of an HCMOS device according to a sixth embodiment in which metallic contact layers low in resistance are formed in the structure shown in FIG. 8.

As shown in FIG. 14, the HCMOS device has source-drain contact W layers 45n, 45p on SiGe layers 36n, 36p which are quantum well regions.

Likewise the fourth embodiment, the sixth embodiment has the following characteristic feature in addition to the characteristic features of the third embodiment. That is, the sixth embodiment comprises channel regions, source-drain regions and source-drain contact layers. The channel regions comprise a first semiconductor layer including a $Si_{1-x-y}Ge_xC_y$ layer ($0 \leq x \leq 1$, $0 \leq y \leq 1$), a second semiconductor layer different in band gap from the first semiconductor layer, and a carrier accumulation layer formed in the vicinity of the interface between the first and second semiconductor layers. The source-drain regions comprise a third semiconductor layer and a fourth semiconductor layer greater in band gap than the third semiconductor layer. The source-drain contact layers are made of conductive layers which are low in resistance and which are formed immediately above the third semiconductor layer.

In the NMOS transistor in the sixth embodiment, a SiGeC layer 34n which is a quantum well region, serves as the first semiconductor layer including a $Si_{1-x-y}Ge_xC_y$ layer ($0 \leq x \leq 1$, $0 \leq y \leq 1$), a first Si layer 33n serves as the second semiconductor layer, the SiGe layer 36n which is a quantum well region serves as the third semiconductor layer, a third Si layer 37n serves as the fourth semiconductor layer greater in band gap than the SiGe layer 36n, and the source-drain contact W layer 45n is formed immediately above the SiGe layer 36n serving as the third semiconductor layer.

In the PMOS transistor of the sixth embodiment, a SiGe layer 36p serves as the first semiconductor layer (y=0) including a $Si_{1-x-y}Ge_xC_y$ layer ($0 \leq x \leq 1$, $0 \leq y \leq 1$) and also as the third semiconductor layer, a third Si layer 37p serves as the second semiconductor layer and also as the fourth semiconductor layer greater in band gap than the third semiconductor layer, and a source-drain contact W layer 45p is formed immediately above the SiGe layer 36p serving as the third semiconductor layer.

As discussed in the foregoing, the sixth embodiment is arranged such that those regions (source-drain contact W layers 45n, 45p) of the substrate which come in contact with the Al source-drain electrodes 41n, 41p, are formed in a semiconductor layer which is smaller in band gap out of the semiconductor layers for forming a channel. This reduces the contact resistance as compared with the arrangement in which the contacts are formed immediately above the Si layers 37n, 37p which are the uppermost semiconductor layers. Thus, the device can be operated at a high speed with lower power consumption.

In particular, the source-drain contact W layers 45n, 45p made of tungsten (W) are so formed as to come in contact with the SiGe layers 36n, 36p. Thus, the source-drain contact W layers 45n, 45p are extremely low in contact resistance.

That is, the sixth embodiment can be arranged to lower the contact resistance, yet producing the effects produced by the third embodiment.

Other Modifications

In each of the first to sixth embodiments, the description has been made of a MOS field-effect transistor unit having a gate insulating layer below a gate electrode. However, the present invention is not limited to such embodiments. In particular, a field-effect transistor unit using a heterointerface instead of a heterojunction MOS structure having an insulating layer at the uppermost layer, can form even a device which does not use an insulating layer but uses a Schottky junction. This enables the resistance to be lowered and is advantageous in view of a high-speed operation with low power consumption.

In each of the first to sixth embodiments, the δ doped layers are formed. However, the present invention is not limited to such an arrangement. That is, the effects of the present invention can be produced with the use of no δ doped layers. Even though the δ doped layers are formed, spacer layers are not necessarily required.

A SiGeC layer containing a trace amount of C may be formed instead of each of the SiGe layers in the first, second, third, fifth and sixth embodiments.

In each of the first, second, third, fifth and sixth embodiments, the SiGeC layers may be disposed above the SiGe layers. In such an arrangement, the source-drain contact W layers may be formed immediately above the SiGeC layers in the source-drain regions.

What is claimed is:

1. A method of producing a semiconductor device including an n-channel field-effect transistor and a p-channel field-effect transistor, comprising:

a first step of forming a first Si layer on a semiconductor substrate;

a second step of forming a first $Si_{1-x-y}Ge_xC_y$ layer (o<x<1, o<y<1) which comes in contact with the upper surface of said first Si layer and is free from strain due to lattice misfit with said first Si layer, and in which a first carrier accumulation layer serving as a channel of said n-channel field effect transistor is formed;

a third step of forming, on said first $Si_{1-x-y}Ge_xC_y$ layer, a second $Si_{1-x-y}Ge_xC_y$ layer (o<x<1, o<y<1) which is different in band gap from said first $Si_{1-x-y}Ge_xC_y$ layer and in which a second carrier accumulation layer serving as a channel of said p-channel field-effect transistor is formed:

a fourth step of forming a second Si layer which is in contact with the upper surface of said second $Si_{1-x-y}Ge_xC_y$ layer;

a fifth step of successively depositing, on said second Si layer, a gate insulating layer and a conductive layer, and patterning said conductive layer to form gate electrodes of said n- and p-channel field effect transistors; and a sixth step of introducing, with said gate electrodes of said field-effect transistors used as masks, (i) n-type impurities into said second Si layer and said first and second $Si_{1-x-y}Ge_xC_y$ layers in the n-channel field-effect transistor forming region in depth which reaches at least said first carrier accumulation layer and (ii) p-type impurities into said second Si layer and said second $Si_{1-x-y}Ge_xC_y$ layer in the p-channel field-effect transistor forming a region at a depth which reaches at least said second carrier accumulation layer, thus forming source-drain regions of said n- and p-channel field-effect transistors.

2. A method of producing a semiconductor device including a field-effect transistor, comprising:

a first step of forming, on a substrate, a first semiconductor layer including a $Si_{1-x-y}Ge_xC_y$ layer (0<x≦1, 0≦y≦1);

a second step of forming a second semiconductor layer which comes in contact with the upper surface of said first semiconductor layer and is different in band gap from said first semiconductor layer, and in which a carrier accumulation layer serving as a channel of said field-effect transistor is formed in a portion which is adjacent to said first semiconductor layer;

a third step of depositing a conductive layer on said second semiconductor layer and patterning said conductive layer to form a gate electrode;

a fourth step of introducing impurities into those portions of a field-effect transistor forming region which are located at both lateral sides of said gate electrode, thus forming source-drain regions, said impurities being introduced to a depth which reaches at least said carrier accumulation layer;

a fifth step of removing said second semiconductor layer in said source-drain regions by etching until at least said first semiconductor layer is exposed; and a sixth step of forming, on the exposed surface of said first semiconductor layer, source-drain contact layers made of conductive layers.

3. A method of producing a semiconductor device including a field-effect transistor comprising:

a first step of forming, a first semiconductor layer on a substrate;

a second step of forming a second semiconductor layer including a $Si_{1-x-y}Ge_xC_y$ layer (0≦x<1, 0≦y<1) which comes in contact with the upper surface of said first semiconductor layer and is different in band gap from said first semiconductor layer, and in which a carrier accumulation layer serving as a channel of said field-effect transistor is formed in a portion which is adjacent to said first semiconductor layer;

a third step of forming a third semiconductor layer on said second semiconductor layer;

a fourth step of forming a fourth semiconductor layer which comes in contact with the upper surface of said third semiconductor layer and is greater in band gap than said third semiconductor layer;

a fifth step of depositing a conductive layer on said fourth semiconductor layer and patterning said conductive layer to form gate electrodes;

a sixth step of introducing impurities into those portions of said first, second, third, and fourth semiconductor layers which are located at both lateral sides of said gate electrode, thus forming source-drain regions, said impurities being introduced to a depth which reaches at least said carrier accumulation layer;

a seventh step of removing said fourth semiconductor layer in said source-drain regions by etching until at least said third semiconductor layer is exposed; and an eighth step of forming, on the exposed surface of said third semiconductor layer, source-drain contact layers made of conductive layers.

4. A method of producing a semiconductor device including an n-channel field-effect transistor and a p-channel field-effect transistor, comprising:

a first step of forming a first Si layer on a semiconductor substrate;

a second step of forming a first $Si_{1-x-y}Ge_xC_y$ layer ($0<x<1$, $0\leq y<1$) which comes in contact with the upper surface of said first Si layer and is free from strain due to lattice misfit with said first Si layer, and in which a second carrier accumulation layer serving as a channel of said p-channel field-effect transistor is formed;

a third step of forming, on said first $Si_{1-x-y}Ge_xC_y$ layer, a second $Si_{1-x-y}Ge_xC_y$ layer ($0<x<1$, $0<y<1$) which is different in band gap from said first $Si_{1-x-y}Ge_xC_y$ layer and in which a second carrier accumulation layer serving as a channel of said n-channel field-effect transistor is formed;

a fourth step of forming a second Si layer which is in contact with the upper surface of said second $Si_{1-x-y}Ge_xC_y$ layer;

a fifth step of depositing, on said second Si layer, a gate insulating layer and a conductive layer in order, and patterning said conductive layer to form gate electrodes of said n- and p-channel field effect transistors; and a sixth step of introducing, with said gate electrodes of said field-effect transistors used as masks, (i) p-type impurities into said second Si layer and said first and second $Si_{1-x-y}Ge_xC_y$ layers in the p-channel field-effect transistor forming region in depth which reaches at least said first carrier accumulation layer and (ii) n-type impurities into said second Si layer and said second $Si_{1-x-y}Ge_xC_y$ layer in the n-channel field-effect transistor forming a region at a depth which reaches at least said second carrier accumulation layer, thus forming source-drain regions of said n- and p-channel field-effect transistors.

5. A method of producing a semiconductor device including a field-effect transistor, comprising:

a first step of forming a first semiconductor layer on a substrate;

a second step of forming a second semiconductor layer which comes in contact with the upper surface of said first semiconductor layer and is greater in band gap than said first semiconductor layer;

a third step of forming a third semiconductor layer including a $Si_{1-x-y}Ge_xC_y$ layer ($0<x\leq 1$, $0\leq y\leq 1$) on said second semiconductor layer;

a fourth step of forming a fourth semiconductor layer which comes in contact with the upper surface of said third semiconductor layer and is greater in band gap than said third semiconductor layer and in which a carrier accumulation layer serving as a channel of said field-effect transistor is formed in a portion of said third semiconductor layer which is adjacent to said fourth semiconductor layer;

a fifth step of depositing a conductive layer on said fourth semiconductor layer and patterning said conductive layer to form gate electrodes;

a sixth step of introducing impurities into those portions of said first, second, third, and fourth semiconductor layers which are located at both lateral sides of said gate electrode, thus forming source-drain regions, said impurities being introduced to a depth which reaches at least said carrier accumulation layer;

a seventh step of removing said fourth semiconductor layer in said source-drain regions by etching until at least said third semiconductor layer is exposed; and an eighth step of forming, on the exposed surface of said third semiconductor layer, source-drain contact layers made of conductive layers.

* * * * *